United States Patent
Steele et al.

(10) Patent No.: US 9,166,750 B1
(45) Date of Patent: Oct. 20, 2015

(54) SOFT DECISION ANALYZER AND METHOD

(71) Applicant: The United States of America as represented by the Administrator of the National Aeronautics and Space Administration, Washington, DC (US)

(72) Inventors: Glen F. Steele, Webster, TX (US); Chatwin Lansdowne, Houston, TX (US); Joan P. Zucha, Pearland, TX (US); Adam M. Schlesinger, League City, TX (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 28 days.

(21) Appl. No.: 13/789,903

(22) Filed: Mar. 8, 2013

(51) Int. Cl.
  *H04L 27/28* (2006.01)
  *H04L 1/24* (2006.01)

(52) U.S. Cl.
  CPC .................................. *H04L 1/242* (2013.01)

(58) Field of Classification Search
  CPC ..................................................... H04L 1/242
  USPC ......... 375/140–142, 147, 150, 260, 213, 219, 375/220, 224, 227, 228, 316, 324, 340; 455/63.1, 67.11, 226.1–226.4
  See application file for complete search history.

(56) References Cited

U.S. PATENT DOCUMENTS

| | | | |
|---|---|---|---|
| 6,373,910 B1 | 4/2002 | Kingston et al. | |
| 6,647,056 B1 * | 11/2003 | Imaizumi et al. | 375/150 |
| 6,802,037 B2 | 10/2004 | Kim et al. | |
| 7,136,445 B2 | 11/2006 | Houtman | |
| 7,296,216 B2 | 11/2007 | Shen et al. | |
| 7,352,720 B2 | 4/2008 | Chang et al. | |
| 7,716,561 B2 | 5/2010 | Belogolovyi et al. | |
| 7,831,895 B2 | 11/2010 | Lin | |
| 2007/0079223 A1 | 4/2007 | Mondin et al. | |
| 2007/0260772 A1 | 11/2007 | Garmonov et al. | |
| 2008/0086670 A1 | 4/2008 | Krouk et al. | |
| 2009/0207836 A1 * | 8/2009 | Kawasaki et al. | 370/352 |
| 2010/0128661 A1 | 5/2010 | Becker et al. | |
| 2010/0178057 A1 * | 7/2010 | Shieh | 398/79 |
| 2010/0215056 A1 | 8/2010 | Ide et al. | |

OTHER PUBLICATIONS

Lansdowne et al., Jitter-Induced Symbol Slip Rates in Next-Generation Ground Segment Receivers, AIAA Space Ops, Apr. 2010, pp. 1-17, Huntsville, AL.
Lansdowne et al., Measurement Techniques for Transmit Source Clock Jitter for Weak Serial RF Links, IEEE, Mar. 1, 2010, pp. 1-5.

* cited by examiner

*Primary Examiner* — Dac Ha
(74) *Attorney, Agent, or Firm* — Kurt G. Hammerle

(57) ABSTRACT

A soft decision analyzer system is operable to interconnect soft decision communication equipment and analyze the operation thereof to detect symbol wise alignment between a test data stream and a reference data stream in a variety of operating conditions.

41 Claims, 15 Drawing Sheets

SOFT DECISION ANALYZER AND METHOD

STATEMENT OF GOVERNMENT INTEREST

The invention described herein was made in the performance of work under a contract of the National Aeronautics and Space Administration (NASA) and is subject to the provisions of Section 305 of the National Aeronautics and Space Act of 1958, Public Law 85-568(72 Stat. 435; now codified at 51 U.S.C. §20135). The invention described herein was also made by employees of the United States Government and may be manufactured and used by or for the Government of the United States of America for governmental purposes without the payment of any royalties thereon or therefor.

FIELD OF THE INVENTION

The invention relates generally to soft decision analyzers and, more particularly, to a soft decision analyzer and method, which in one embodiment, may be utilized for analyzing performance of forward error correction (FEC) techniques and corresponding communication system devices in real-time actual operating conditions and environments.

SUMMARY OF THE INVENTION

In accordance with one embodiment of the present invention, a soft decision analyzer (SDA) is provided that is operable for use with (1) Radio Frequency (RF) communication equipment such as a data source that produces a reference data stream comprising data and clock, (2) an RF transmitter that transmits the reference data stream to produce a transmitted data stream, (3) an RF receiver that receives the transmitted data stream and produces a test data stream that may comprise soft decision information and clock, and (4) a baseband signal processor (BSP) operable to detect the test data stream.

In another embodiment, an apparatus may comprise a signal conditioner operable for connecting to the RF receiver, the baseband signal processor, and the reference data source. Furthermore, the apparatus may comprise a correlator operable to detect symbol wise alignment of the test data stream and/or produce a historical record relating to the symbol wise alignment, and/or a configuration and timing control operable to control operation of the signal conditioner and the correlator. In another embodiment, the signal conditioner can be operable for bridging electrical differences between the RF receiver and the baseband signal processor when the RF receiver and the baseband signal processor are incompatible with each other.

In another embodiment, the soft decision analyzer may further comprise a simulator operable to synthetically produce the test data stream and the reference data stream in a plurality of different receiver modulation formats without connection to the data source, the RF transmitter, and/or the RF receiver. In yet another embodiment, the simulator is operable to slip the simulated test data stream and the reference data stream relative to one another in both forward and reverse directions by a selectable number of symbols.

In yet another embodiment, the signal conditioner is operable to format a plurality of different RF receiver outputs into an internal soft decision analyzer conditioned format, which comprises the test data stream and the reference data stream. The signal conditioner may further comprise an input scaler operable to accept soft decision data expressed in a plurality of different mathematical representations for conversion to an internal soft decision analyzer mathematical representation of soft decision data.

In another embodiment, the signal conditioner further comprises an output scaler operable to convert the internal soft decision analyzer mathematical representation of soft decision data to a selectable mathematical format consistent with that of different types of baseband signal processors. In yet a further embodiment, the signal conditioner is under control of the configuration and timing control and is operable to remap inputs to account for cables with wiring errors. In yet a further embodiment, at least a portion of the signal conditioner and the correlator are implemented in programmable hardware. A control interface is provided which can be utilized for this purpose as well as others.

In yet another possible embodiment, the soft decision analyzer is operable for use with a reference data stream that is not limited to a predetermined sequence of data and wherein the test data stream is suitable for detection by the baseband signal processor when the baseband signal processor employs a forward error correction (FEC) technique. The invention may further comprise a simulated data source being operable to produce signals representative of a plurality of different types of RF receivers.

In another embodiment, a correlator which receives a conditioned format or stream comprising the test data stream and the reference data stream is operable for detecting symbol wise alignment between the test data stream and the reference stream and for producing an output for adjusting the timing between the test data stream and the reference data stream. The correlator may comprise a bank of individual correlators that operate together. Also, the correlator may compare respective outputs of the bank of correlators to produce a winning correlation result for detecting the symbol wise alignment.

In another embodiment, the soft decision analyzer may comprise a slip alignment block that provides feedback for adjusting a symbol wise timing between the test data stream and the reference data stream. In one possible embodiment, a statistical portion is operable to collect statistical data of slips and rotations in the test data stream.

The soft decision analyzer may further comprise a slip alignment block that produces slip statistical data and a clock phase detector that produces clock edge-based slip performance data. In one embodiment, a bit error detection block receives the correlated reference data and the correlated test data to produce hard decision bit error performance data.

The soft decision analyzer may comprise a test stream buffer and a reference stream buffer operable to provide a first-in, first-out buffering action to isolate an output of the stream buffer and an output of the reference stream buffer from instantaneous data rate slipping between the test data stream and the reference data stream. In this embodiment, at least one of the test stream buffer and the reference stream buffer is operable to bring the test stream and the reference stream into symbol wise alignment.

In accordance with another embodiment, a method for operating a soft decision analyzer is provided. The method may comprise providing a signal conditioner operable for connecting to a RF receiver, a baseband signal processor, and/or a data source. Furthermore, the method may comprise detecting symbol wise alignment of a reference data stream and producing a historical record relating to the symbol wise alignment.

In another possible embodiment, the method may comprise providing a bridge between the RF receiver and the baseband signal processor when the RF receiver and the baseband signal processor are incompatible with each other.

The method may further comprise synthetically producing the test data stream and the reference data stream in a plurality of different receiver modulation formats without connection to the data source, the RF transmitter, and/or the RF receiver.

In one embodiment, the method may comprise slipping the test data stream and the reference data stream relative to one another in both forward and reverse directions by a selectable number of symbols.

In yet another embodiment, the method may comprise providing a signal conditioner that is operable to format a plurality of different RF receiver outputs into an internal soft decision analyzer conditioned format, which comprises a test data stream and a reference data stream. The method may further comprise accepting soft decision data expressed in a plurality of different mathematical representations for conversion to an internal soft decision analyzer mathematical representation of the soft decision data.

In another embodiment, the method may comprise converting the internal soft decision analyzer mathematical representation of soft decision data to a selectable mathematical format consistent with that of different types of the baseband signal processor. In a further embodiment, the method may comprise remapping inputs to account tbor cables with wiring errors. In yet a further embodiment, at least a portion of the signal conditioner and the correlator are implemented in programmable hardware.

In yet another embodiment, a method may comprise providing a soft decision analyzer that is operable for use with a reference data stream that is not limited to a predetermined sequence of data and wherein a test data stream is suitable for detection by a baseband signal processor when the baseband signal processor employs a forward error correction technique. The method may further comprise providing a simulated data source operable to produce signals representative of a plurality of different types of RF receivers.

In another embodiment, the method may comprise receiving a conditioned format or stream comprising the test data stream and the reference data stream of the correlator and detecting symbol wise alignment between the test data stream and the reference stream. Other steps comprise producing an output for adjusting the timing between the test data stream and the reference data stream. The method may comprise comparing respective outputs of a bank of correlators to produce a winning correlation result for detecting symbol wise alignment.

The method may further comprise adjusting a symbol wise timing between the test data stream and the reference data stream. In one possible embodiment, the method steps include collecting statistical data of slips and rotations in the test data stream.

In another embodiment, the method may comprise producing slip statistical data and/or producing clock edge-based slip performance data. The method may further comprise receiving the correlated reference data and the correlated test data to produce hard decision bit error performance data.

The method may further comprise providing a first-in, first-out buffering action to isolate an output of the data stream buffer and an output of the reference stream buffer from instantaneous data rate slipping between the test data stream and the reference data stream. At least one of the test stream buffer and the reference stream buffer may be provided, in which each buffer is operable to bring the test stream and the reference stream, respectively, into symbol wise alignment. The method may also comprise detecting channel swapped conditions for quadrature phase shift keyed (QPSK) systems and adjusting for the occurrence of a QPSK channel swapped condition.

BRIEF DESCRIPTION OF THE DRAWINGS

A more complete understanding of the embodiments described herein and many of the attendant advantages thereto will be readily appreciated as the same becomes better understood by reference to the following detailed description when considered in conjunction with the accompanying drawings, wherein.

The above general description and the following detailed description are merely illustrative of the generic invention, and additional modes, advantages, and particulars of this invention will be readily suggested to those skilled in the art without departing from the spirit and scope of the invention.

DETAILED DESCRIPTION OF EXEMPLARY EMBODIMENTS

Detailed descriptions of exemplary embodiments are provided herein. It is to be understood, however, that the present invention may be embodied in various forms. Therefore, specific details disclosed herein are not to be interpreted as limiting, but rather as a basis for the claims and as a representative basis for teaching one skilled in the art to employ the embodiments described herein in virtually any appropriately detailed system, structure or manner.

Soft Decision Analyzer 100, also referred to herein as "SDA", is a hardware, firmware, and software system which provides the capabilities to perform real time closed loop statistical analysis of the performance of single-channel or dual-channel serial digital radio frequency (RF) communications systems for a variety of operating conditions. In at least one embodiment described herein, "soft decision data" is comprised of a digital sign bit and soft decision level bits that provide an indication on how confident an RF receiver categorized the digital sign bit as a "1" or a "0".

Figure 1:
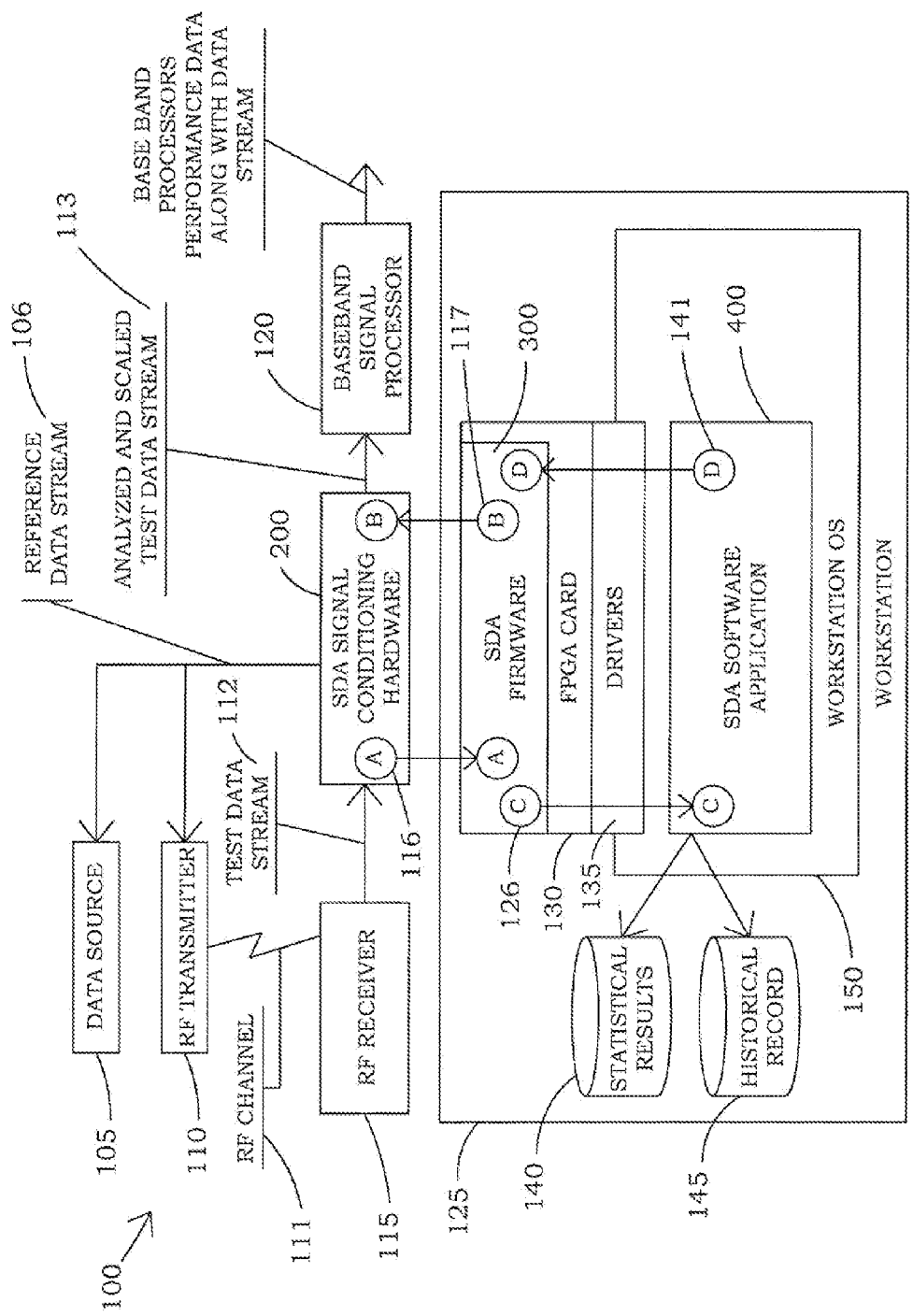
FIG. 1 is a flow diagram depicting top-level components of a soft decision analyzer (SDA) in accord with one possible embodiment of the present invention.

Turning now to the drawings, and more particularly FIG. 1, a schematic diagram of a system comprising a soft decision analyzer is shown in accord with one possible embodiment of the present invention. Soft Decision Analyzer 100 is used in testing and development of soft decision-based communications systems and can be used in a variety of useful configurations. FIG. 1 depicts a top level illustration of components of SDA 100 in relation to exemplary external devices which SDA 100 is intended to test. The representative external devices of a RF communications system comprise Data Source 105, RF transmitter 110, RF receiver 115 and baseband signal processor (BSP) 120, shown in FIG. 1 in a general configuration as the devices under test, or "DUT", and in its relation to components of SDA 100.

Alternative configurations are available depending on whether the test activities are focused solely on RF receiver 115, focused solely on BSP 120, or focused on the combined interaction between RF receiver 115 and BSP 120. RF transmitter 110, RF channel 111, and RF receiver 115 are usually a common source of signal quality issues like inter-symbol interference and cross-channel interference. Furthermore, SDA 100 is not limited to soft decision communication systems, as there are alternative configurations wherein SDA 100 may prove useful, such as with hard decision devices under test.

As shown in FIG. 1, data source 105 supplies a reference data stream 106 with content suitably composed for interpretation by BSP 120. Reference data stream 106 may be hereinafter also referred to as the "REF data stream", "REF stream", "REF sequence" or simply "REF" depending on context. Reference data stream 106 is comprised of both data and clock digital signals. Identical copies of REF Stream 106 are routed to both RF transmitter 110 and a signal conditioning hardware 200. RF transmitter 110 transmits REF data stream 106 to RF receiver 115 via RF channel 111. RF receiver 115 also recovers TEST data stream 112, which is related to REF data stream 106, but may include significant alterations in characteristics and content due to data corruption caused by characteristics of RF channel 111 and performance of RF receiver 115. Test data stream 112 may include digital soft decision data comprising a plurality of symbols including a sign bit and magnitude. Like REF data stream 106, TEST data stream includes associated digital clock signals. Hereinafter, test data stream 112 may also be referred to as "TEST data stream". "TEST stream". "TEST sequence" or simply "TEST" depending on the context. The data streams are not limited to any particular sequence of data, such as repeating or canned data streams.

Figure 7:
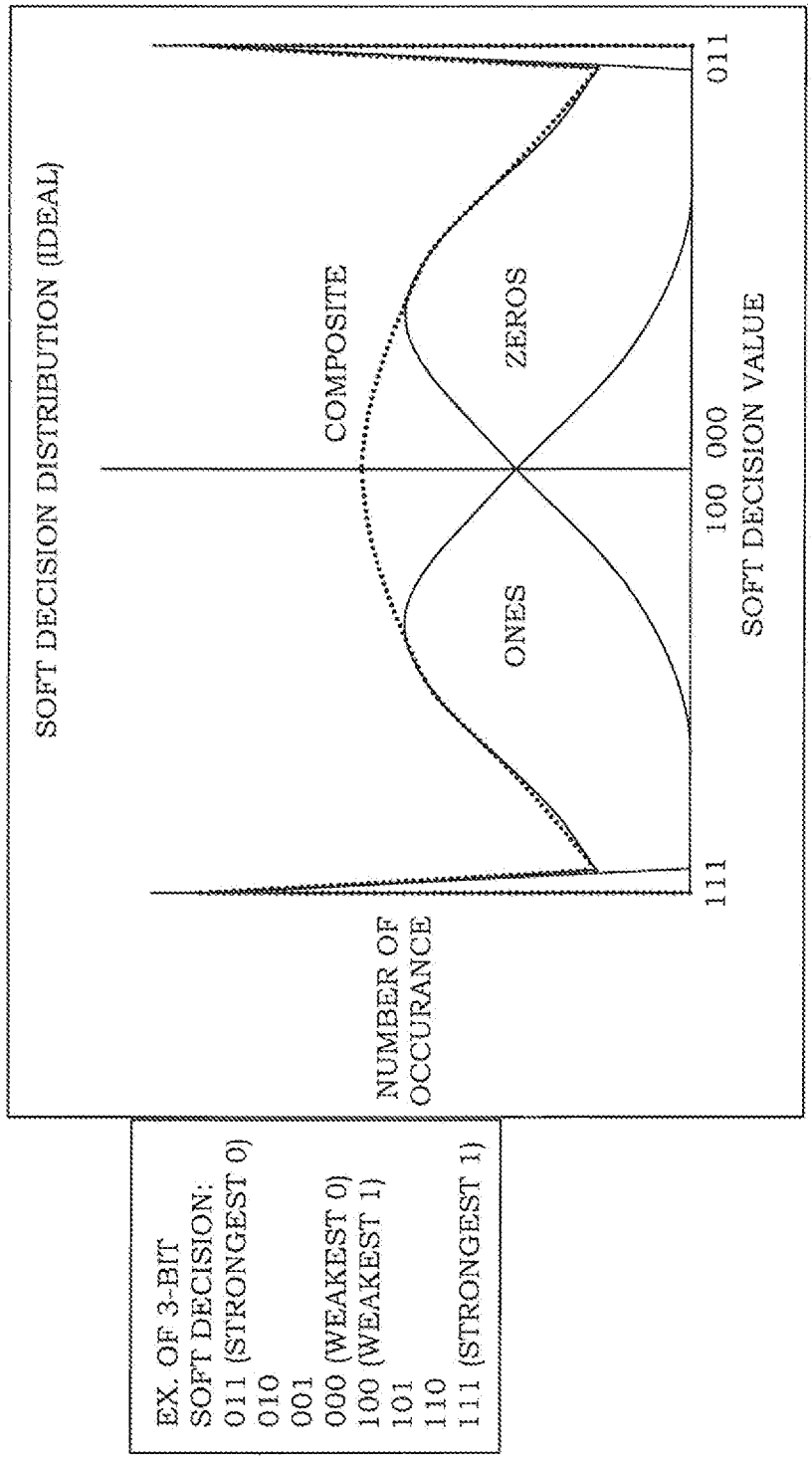
FIG. 7 is a histogram depicting soft decision data values in accord with one possible embodiment described herein.

FIG. 7 illustrates a soft decision data plot in a histogram format based on a fixed number of soft decision samples. In our example, a three bit soft decision binary value as expressed in a sign magnitude format has the form of "SMM", where "S" is the sign bit and "MM" is the magnitude. The higher the soft decision magnitude, the greater the perceived confidence the receiver assigned to the sign bit of a TEST symbol. Depending on the sign convention, the plot may then also be further away from the center of the graph. Accordingly, output from a receiver under test in a soft decision system distinguishes between a symbol identified as a zero with a high degree of confidence and a zero so identified with a low degree of confidence. Similarly, a receiver in a soft decision system distinguishes between a symbol identified as a one identified with a high degree of confidence and a one with a low degree of confidence.

When discussing SDA 100, one should understand TEST data stream 112 is a degraded, time delayed version of REF data stream 106. As discussed hereinbefore, TEST stream 112 and REF streams 106 are typically derived from components configured as shown in FIG. 1. Sources that contribute to the delay between the REF and TEST streams include the processing time for RF transmitter 110, processing time for RF receiver 115, and time for RF channel 111 to transmit data between transmitter and receiver. Degradation of TEST data stream 112 is primarily related to channel conditions and the way internal electronics of receiver 115 interact with channel conditions. Receivers can make errors when creating TEST data stream 112 of soft decision data. Typically the errors are due to receiver 115 coping with RF channel conditions. An error in this context is defined as when the sign bit of the soft decision TEST stream is not contextually in agreement with the associated hard decision sign bit of REF stream 106.

The need for electrical signal conversion between electrically incompatible receivers and baseband signal processors is driven by early investigations of communications systems. Early conceptualization and early testing can significantly assist in reduced nonrecurring costs of systems derived from pre-existing equipment designs. Signal conditioning hardware 200 provides for several aspects of interfacing such incompatible devices under test and allows for preliminary investigations of combinations of receiver 115 and/or baseband signal processor 120 without expending the cost to develop a completed system.

The evaluation of the two streams of data against one another is meaningful when the two streams align in time and have an understood polarity relationship regarding the sign bit. Several factors affect the timing relationship between the two streams. First, test data stream 112 and reference data stream 106 follow different physical data paths and subsequently arrive at SDA 100 with an arbitrary timing relationship, i.e., they are asynchronous. Second, the timing between the two streams changes based on the motion of RF transmitter 110 relative to receiver 115. Third, the bit sync process of receiver 115 can make mistakes and insert additional symbols or delete symbols in TEST data stream 112, typically due to low signal to noise conditions at the input of receiver 115 under test.

The insertion or deletion of symbols by receiver 115 is known as a "slip." The fourth factor that affects stream alignment is related to jitter performance of all the elements that lead up to SDA 100. For example, the digital clocks within the transmitter 110 are not the same as the digital clock in receiver 115 and will drift relative to one another. Even receivers that coherently lock their internal clock to a transmitter's carrier frequency have tracking loops that will on average keep the clock rates the same. However, instantaneously the phases between the transmitted and received streams can vary by significant fractions of a symbol period that can affect the timing relationship between the TEST and REF streams as seen by any equipment downstream of receiver 115, i.e. signal conditioning hardware 200 or BSP 120.

In one embodiment, signal conditioning hardware 200 is a system of one or more printed circuit boards (PCBs) that work together to bridge potentially incompatible digital electronic interface families between all potential devices under test to SDA 100. Thus, signal conditioning hardware 200 can provide for the adaptation of incompatible digital electronic formats and can provide a means to interface RF receiver 115 with baseband signal processor 120 even if their digital logic interfaces are incompatible. In addition, signal conditioning hardware 200 provides a single digital interface family to and from field programmable gate array (FPGA) input/output (I/O) pins hosted on FPGA card 130 As discussed in more detail hereinafter, the signal conditioning hardware 200 buffers and copies input TEST data stream 112, REF data stream 106, and analyzed and scaled test data stream 113, as well as miscellaneous signals used to expose internal operation of SDA firmware 300 at test points suitable for monitoring by additional equipment often used in testing communication systems, such as oscilloscopes and logic analyzers.

Complicating the determination of stream alignment between TEST data stream 112 and reference data stream 106 are issues related to receiver 115 assignment of sign bit polarity to TEST data stream 112, which is an issue for both staggered quadrature phase shift keying (SQPSK) and quadrature phase shift keying (QPSK) type receivers. When either of these receivers locks to its respective carrier, receiver 115 makes a polarity sense assignment to the soft decision sign bit. Additionally, in a QPSK system, receiver 115 makes a channel assignment.

Figure 5:
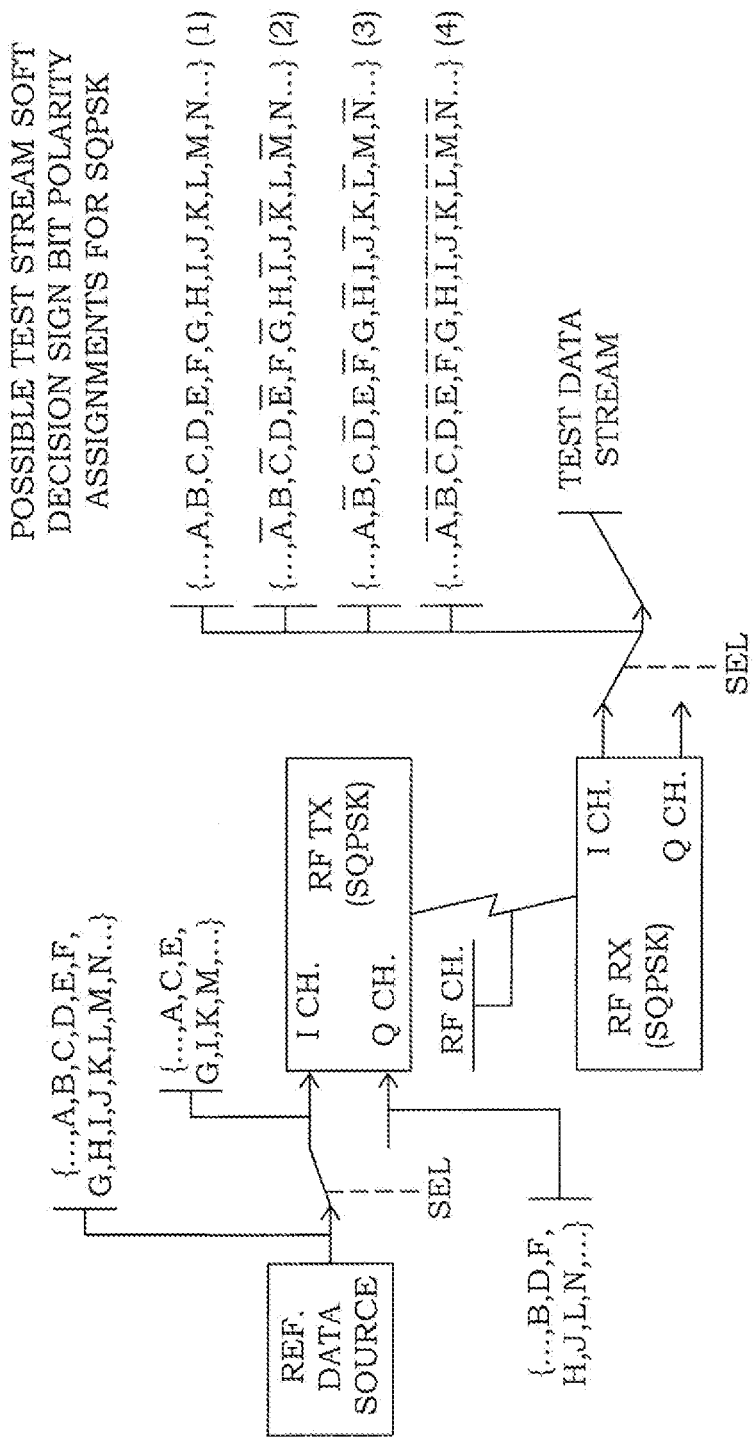
FIG. 5 is a diagram of possible TEST stream soft decision data sign bit polarity assignments in a staggered quadrature phase shift keyed (SQPSK) communication system in accord with an embodiment described herein.
Figure 6:
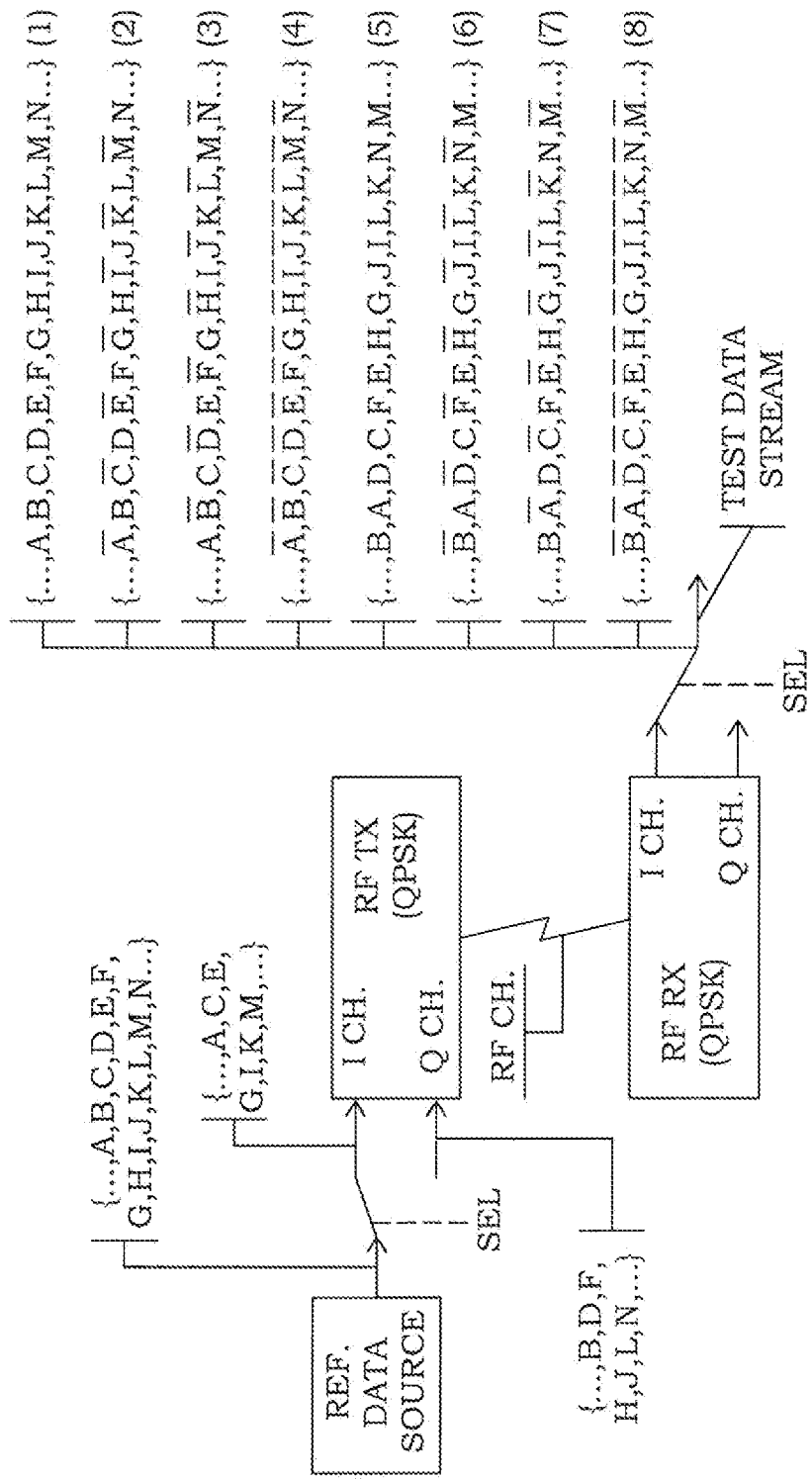
FIG. 6 is a diagram of possible TEST stream soft decision data sign bit polarity assignments and channel swaps in a quadrature phase shift key (QPSK) communication system in accord with one possible embodiment described herein.

Referring now to FIGS. 5 and 6, possible outcomes for the above described sign bit polarity and channel assignments are depicted. FIG. 5 depicts all possible test stream soft decision sign bit polarity assignments for a staggered quadrature phase shift keyed, or SQPSK, receiver. In Example (1), all soft decision sign bit polarity matches REF stream. Thus, all soft decision sign bits in the multiplexed TEST stream are the same polarity sense as the REF stream. The second example illustrates the situation where the polarity sense of the I Channel soft decision sign bits is inverted. Therefore, every other soft decision sign bit is inverted in the multiplexed TEST stream. The third example illustrates the situation where the polarity sense of the Q Channel soft decision sign bits is inverted. Thus, every other soft decision sign bit, opposite of Example (2) above, is inverted in the multiplexed TEST stream. Finally, the fourth example depicts all soft decision sign bits as inverted. Thus, all polarity senses of the soft decision sign bits of the multiplexed TEST stream are inverted to that of the REF stream in Example (4).

Turning now to FIG. 6, a number of possible test stream soft decision sign bit polarity assignments and channel swaps for a quadrature phase shift keyed, or QPSK, receiver is shown. Example (1) illustrates the situation of no channel swapping or inverted polarity, i.e., the soft decision sign bit polarity matches the REF stream. Thus, all soft decision sign bits in the multiplexed TEST stream have the same polarity sense as that of the REF stream. The second example represents no channel swapping, but the polarity sense of the I Channel soft decision sign bits is inverted. This situation means every, other soft decision sign bit is inverted in the multiplexed TEST stream. The third example represents a TEST stream with no channel swapping, but the polarity sense of the Q Channel soft decision sign bits is inverted. Thus, every other soft decision sign bit, opposite of Example (2) above, is inverted in the multiplexed TEST stream. The fourth example also contains no channel swapping. However, all soft decision sign bits are inverted. Therefore, all polarity senses of the soft decision sign bits of the multiplexed TEST stream are inverted to that of the REF stream in Example (4).

Still referring to FIG. 6, Example (5) depicts the situation where the soft decision sign bit polarity matches the REF sequence, but channel swapping has occurred. Thus, all soft decision sign bits in the multiplexed TEST stream have the same polarity sense to that of the REF stream. The sixth example depicts inverted I channel soft decision sign bits polarity sense and channel swapping. Thus, every other soft decision sign bit is inverted in the multiplexed TEST stream. Example (7) illustrates the situation where the polarity sense of the Q Channel soft decision sign bits is inverted and channel swapping has taken place. Thus, every other soft decision sign bit, with respect to the preceding Example (6), is inverted in the multiplexed TEST stream. The final example illustrates channel swapping, as well as all soft decision sign bits being inverted. Therefore, all polarity senses of the soft decision sign bits of the multiplexed TEST stream are inverted to that of the REF stream in Example (8).

After receiver 115 locks to the transmitted carrier frequency and makes the initial assignment of polarity sense of the soft decision sign bit data and the channel assignment, perturbations to internal carrier tracking algorithms of receiver 115, generally due to low signal to noise conditions at the input of the receiver under test, can cause receiver 115 to spontaneously alter sign bit data polarity assignment or assignment of channel data of TEST data stream 112, such as in the case of a QPSK receiver. Such spontaneous reassignments are known as "constellation rotations" or simply "rotations." SDA 100 provides the capacity to adjust for these dynamic rotations and channel swap phenomenon during routine operation.

Figure 2:
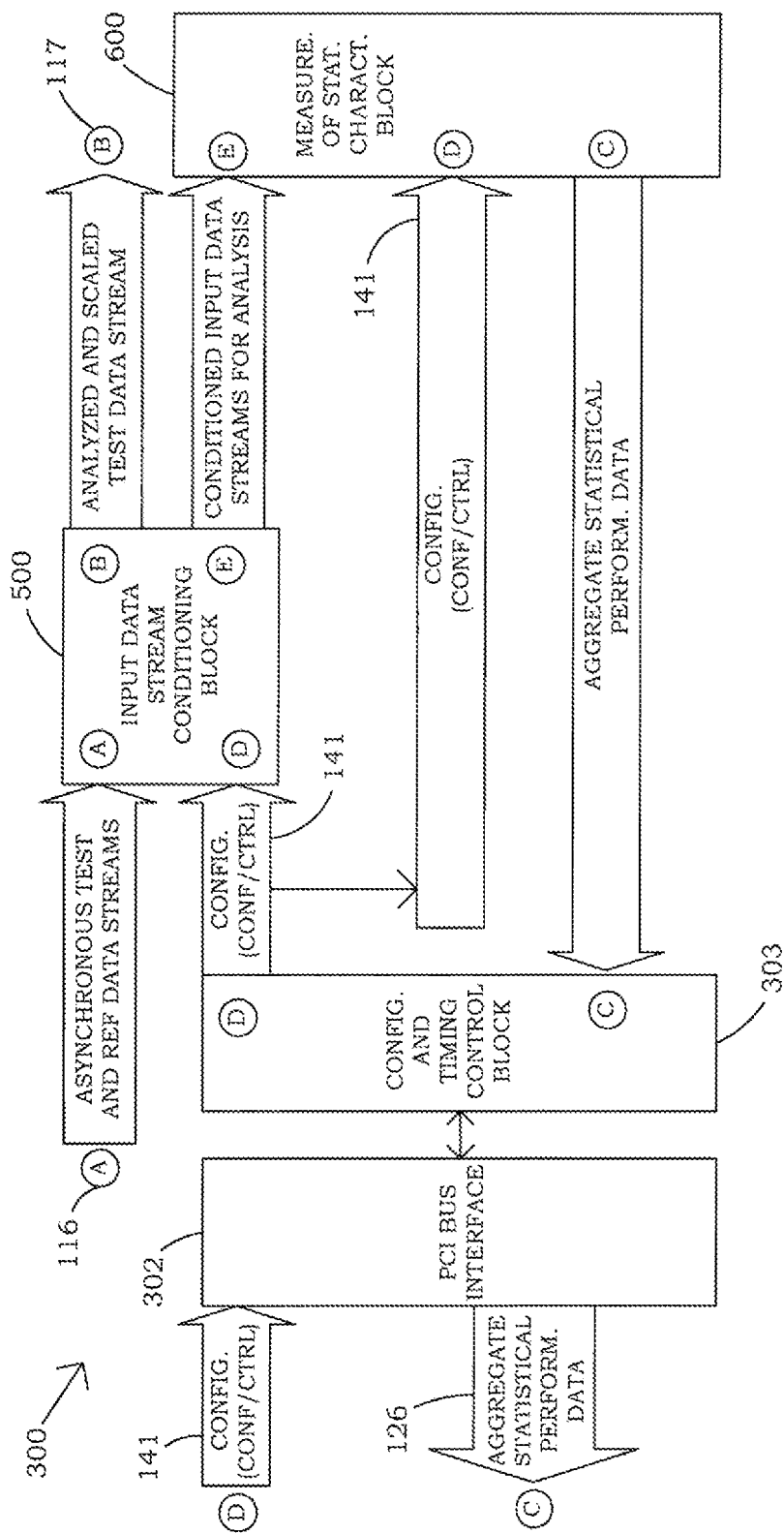
FIG. 2 is a top level diagram of the flow of data in exemplary firmware of the soft decision analyzer.

Referring again to FIG. 1, SDA firmware 300 represents a digital design that is hosted within a commercially available (i.e., vendor-provided) field programmable gate array (FPGA) card 130. Data path A 116, data path B 117, data path C and data path D of FIGS. 1 and 2 depict the interaction and flow of data between hardware 200, firmware 300, and software 400 segments of SDA system 100. In FIG. 2, a Peripheral Component Interconnect (PCI) bus interface 302 is depicted to show the design of SDA 100 in this embodiment. The purpose of PCI Bus Interface 302 is to manage the flow of information between SDA software 400 and SDA firmware 300, although other embodiments could use a number of differing technologies to provide an equivalent interface.

As given in the embodiment of FIG. 2, characteristics of SDA firmware 300 are shown implemented within the blocks depicted in FIG. 2 and include input data stream conditioning block 500, configuration and timing control block 303, and correlation and measurement of statistical characteristics block 600. The vendor-provided PCI bus interface 302 is an optional portion of this embodiment of SDA 100. In an alternative embodiment, functions expressed in the firmware 300 of SDA 100 could be performed by a specific vendor's FPGA or a specific vendor-purchased FPGA card, thus permitting the vendor provided PCI bus interface 302 to be removed from SDA 100. The function of vendor purchased FPGA card 130 is to host focused development of SDA firmware 300 design and to facilitate operation with hosting workstation 125 of FIG. 1. Commercially available vendor provided FPGA card 130 facilitates exchange of data between SDA firmware 300 and SDA software application 400 as depicted by data path C and data path D. Drivers are also provided as indicated at block 135.

Data path C also represents an aggregate of statistical performance data 126 determined by an analysis function of SDA firmware 300 and is used to drive further software analysis, provide information to software graphical displays, and provide status information regarding internal operation of SDA firmware 300. Data path D 141 also represents an aggregate flow of signals 141 under control of SDA software application 400 used to configure and control operation of SDA firmware 300. The configuration and control aggregate 141 of data path D is discussed in further detail below.

Input data stream conditioning block 500 processes the asynchronous TEST data stream 112 and REF data stream 106, or data path A 116, to a digital format, which includes timing characteristics. Further, this digital format is compatible with the statistical analysis performed by the correlation and measurement of statistical characteristics block 600 and to a format compatible with use of the data by data path B 117 and data path E 119. In this embodiment, asynchronous TEST data stream represents up to 12 bits of soft decision data that can be delivered to SDA 100 based on a variety of different timing and signaling schemes associated with binary phase shift keying (BPSK), quadrature phase shift keying (QPSK) or staggered QPSK (SQPSK) modulation for both data path A 116 and data path B 117.

Data path B 117 represents processed, analyzed and scaled test data stream 113 sent to signal conditioning hardware 200 where it is electrically converted to signals compatible with the input format of baseband signal processor 120. In addition, data path B 117 comprises a number of miscellaneous signals used to expose internal operation of SDA firmware 300 to test points suitable for monitoring with oscilloscopes and logic analyzers.

Figure 3:
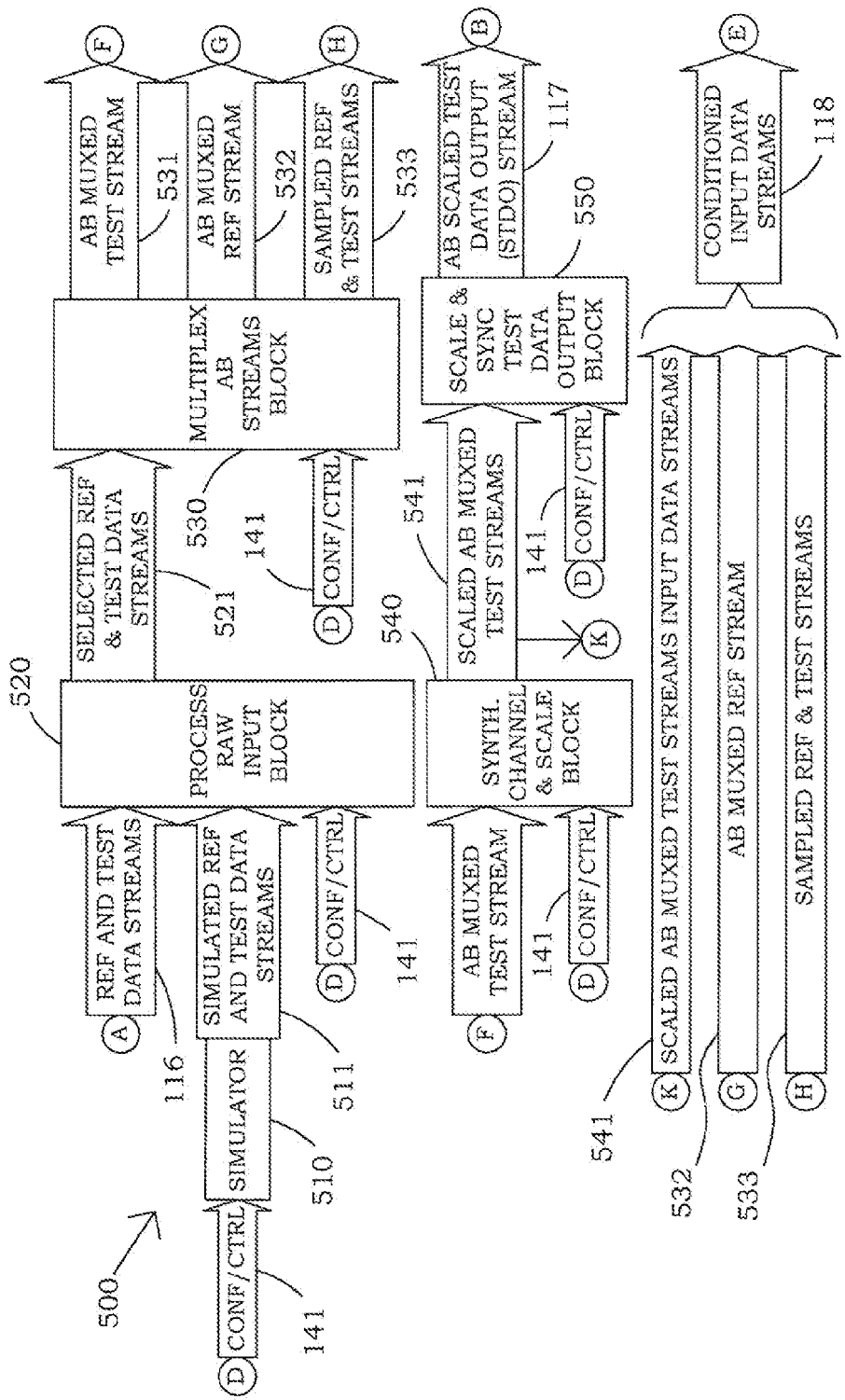
FIG. 3 is a flow diagram of data within an input data stream conditioning block of the SDA firmware represented in FIG. 2.

Turning now to FIG. 3, elements associated with possible embodiments of input data stream conditioning block 500 are illustrated. Input data stream conditioning block 500 can provide SDA 100 with a number of well integrated capabilities when working with a soft decision data stream in a single piece of test equipment. In one embodiment, input data stream conditioning block 500 can bridge between incompatible receiver 115 and baseband processor 120 equipment combinations in a testing environment. In one embodiment, block 500 can apply synthetic RF channel soft decision characteristics to digital data source 105 for evaluating performance of baseband signal processor 120 without use of RF receiver 115. Input data stream conditioning block 500 can also be used to format a multitude of different receiver output formats, such as BPSK. QPSK and SQPSK discussed hereinbefore, into a conditioned single unified format or conditioned stream 118 for statistical analysis by correlation and measurement of statistical characteristics block 600 (see FIG. 4B).

Continuing with FIG. 3, in one embodiment simulated data source or "simulator" 510 is a resource internal to SDA 100 utilized to provide a simulated TEST data stream and simulated REF data stream 511. Simulator 510 can be used to supply an internally generated source of simulated TEST stream data and REF stream data that exercises a majority of SDA 100 features without having to configure SDA 100 with external test elements. Via configuration of data path D 141, simulator 510 generates many different formats of test data simulating the attachment of BPSK, QPSK or SQPSK type RF receivers. Thus, SDA 100 may be operated without data source 105, RF transmitter 110, RF receiver 115 or baseband signal processor 120 as shown in FIG. 1. This block can be used via data path D 141 to slip the simulated REF and TEST streams relative to one another in both forward or reverse directions a selectable or an arbitrary number of symbols and is used as one method to demonstrate and verify the ability of SDA 100 to track receiver induced symbol slips. In conjunction with synthetic channel and scale block 540, means are provided to develop associated SDA firmware 300 and SDA software 400 without SDA 100 being configured in a complete test configuration.

Process raw input block 520 can provide three functions for operation of the present embodiment. First, block 520 synchronizes both the real asynchronous TEST and REF data streams, or data path A, and the simulated asynchronous TEST and REF data streams, data path B, to the SDA's internal system clock. In doing so, protection is provided against metastability conditions that would interfere with the remainder of SDA firmware 300. The second function is to provide a means via data path D 141 to select either the simulated data streams 511 or data streams from a device under test, data path A 116, to a multiplex AB streams block 530 via data path 521. Finally, process raw input block 520 provides the ability to correct for data inversions present on any soft decision bits, clocks and flags associated with TEST data streams 112 and REF data streams 106 at an electrical signaling level.

Multiplex AB streams block 530 can perform two functions. Block 530 converts both REF stream 106 and TEST stream 112 from specific timing formats associated with BPSK, QPSK or SQPSK data sources to a format compatible with the internal timing format of SDA 100. This functionality makes it possible to pass TEST stream soft decision data 531 and REF stream soft decision data 532 to other firmware blocks that perform statistical analysis on the stream data regardless of the originating data source. Specifically, this block allows SDA 100 to accommodate RF receivers 115 that utilize BPSK, QPSK or SQPSK modulation. The second function block 530 provides is to acquire and direct a sampled copy of the REF and TEST data streams 533 to a clock phase detector block 630. Clock phase detector block 630 provides one of the two methods SDA 100 utilizes to track receiver symbol slip performance.

Synthetic channel and scale block 540 can provide three functions: (1) input scaling; (2) output scaling; and (3) synthetic channel substitution. These functions of block 540 allow SDA 100 to cope with dynamically changing devices under test, which is typical of a prototyping environment. These functions also handle errors and incompatibilities in signaling between devices under test because all devices have some technical issues. Block 540 also serves as a translator to allow for the interface and testing of normally incompatible combinations of RF receiver 115 and baseband signal processor 120. Block 540 primarily deals with the mathematical representation of the soft decision data and does not concern itself with external timing issues present at the inputs and outputs of SDA 100. Digital clock and timing issues are handled by multiplex AB streams block 530 and scale and sync test data output block 550.

Input scaling by block 540 allows for SDA 100 to interface its internal soft decision data paths with any arbitrary mapping provided by receiver 115 without re-cabling the setup of the device(s) under test. Block 540 thus allows for SDA 100 to be flexible in its ability to cope with receivers and their associated cabling that may have wiring errors. The ability of SDA 100 to remap soft decision digital inputs provides a means for rapidly remapping the errant soft decision bits to a useable interpretation and for immediately continuing the testing instead of waiting for a lengthy time to correct for errors of this nature. In addition, the input scaling function provides a means for SDA 100 to accept soft decision data expressed in a mathematical two's complement, one's complement, sign magnitude or other variations to the internal mathematical representation of SDA 100. Converting the TEST Stream 112 soft decision's mathematical representation to an internally consistent mathematical representation of SDA 100 facilitates the further analysis by other elements. Input scaling can be accomplished by configuration via data path D 141 and is under the control of SDA software application 400.

Output scaling maps the internal mathematical representation of the TEST stream soft decision data 531, performed by the SDA 100, back to a mathematical format consistent with the logic technology of baseband signal processor 120. Typical mathematical representations of the soft decision data expected by baseband signal processors 120 are as a one's complement, a two's complement, or a sign magnitude digital value. Thus, the combined use of input scaling and output scaling within SDA 100 allows for bringing normally incompatible combinations of RF receiver and baseband signal processor together for testing. For example, RF receiver 115 with a soft decision width of 6 bits and with soft decision values expressed in a one's complement format can be made compatible with a baseband signal processor 120 having a soft decision width of 12 bits with soft decision values expressed in a sign magnitude. Output scaling can also be utilized to rapidly, arbitrarily map soft decision digital outputs to a baseband signal processor without changing the physical test configuration. Output scaling can be accomplished by a configuration utilizing data path D 141 under the control of SDA software application 400.

Synthetic channel substitution provides a way to alter TEST stream soft decision data 531 characteristics to baseband signal processor 120. A primary function is to provide a way to simulate differing RF channel 111 conditions as a soft decision symbol error generator to quickly test baseband signal processor 120 without actually having to utilize an RF transmitter/receiver pair. In addition, the soft decision synthetic channel substitution provides a means to test and verify, in a repeatable way, internal analysis elements that are a part of SDA 100. In one embodiment, all synthetic channel substitution can be accomplished by configuration via data path D 141 under the control of SDA software application 400.

Scale and sync test data output block 550 provides a means to convert a scaled TEST data stream 541 with internal timing of SDA 100 to data path B 117 having digital timing characteristics as if it were originating from a BPSK, QPSK or SQPSK receiver. Block 550 selectively mimics the digital timing characteristics of a BPSK, QPSK or SQPSK receiver as directed via SDA software 400 through data path D 141. Block 550 along with multiplex AB streams block 530 provides a way to match the digital timing associated with TEST data streams 112 even for a normally incompatible combination of RF receiver 115 and BSP 120. For example, a RF receiver 115 that utilizes a BPSK modulation scheme can be paired with a BSP 120 that is designed to interface to a QPSK receiver.

Figure 4A:
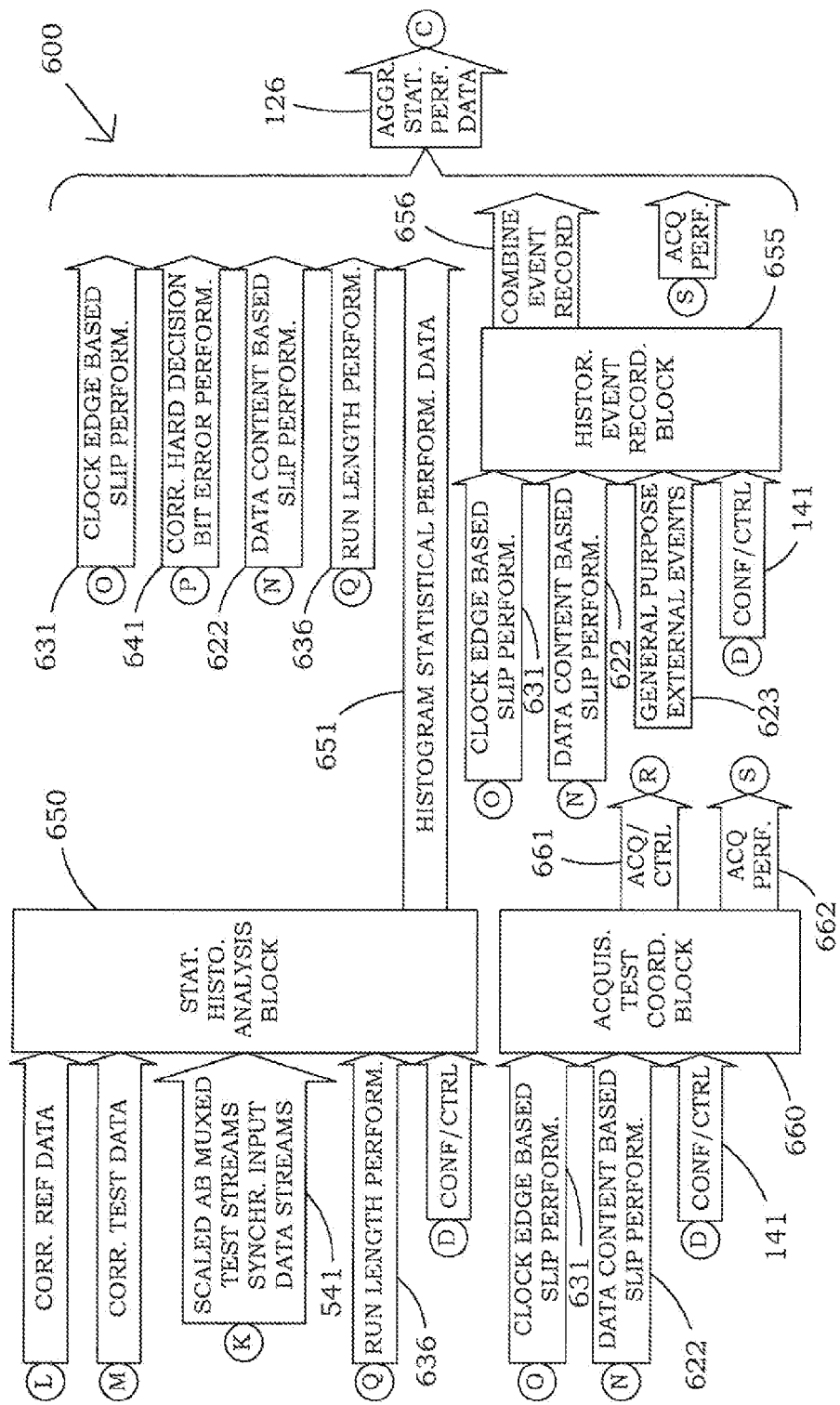
FIG. 4A is a flow diagram of data within a measurement of statistical characteristics block of the SDA firmware represented in FIG. 2.
Figure 4B:
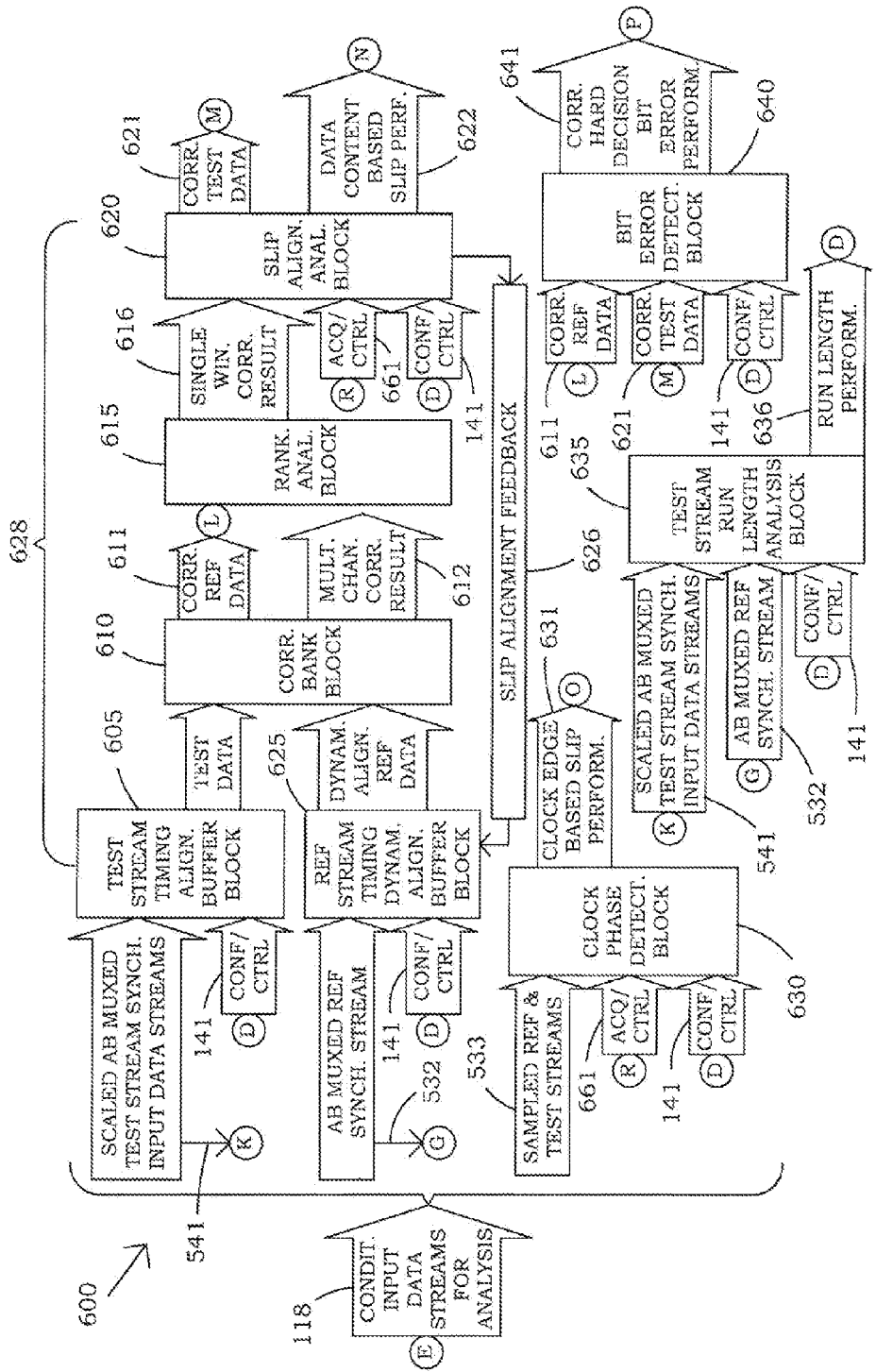
FIG. 4B is a companion flow diagram of data in the measurement of statistical characteristics block depicted in FIG. 4A.

Referring now to FIGS. 4A and 4B, firmware elements of the measurement of statistical characteristics block 600 are depicted. Block 600 aligns TEST stream 112 and REF data stream 106 through a process of soft decision correlation analysis and feedback. In addition, once TEST and REF data streams are aligned, block 600 categorizes and collects statistical information regarding the behavior of the primary device under test. The resultant collection of statistical information is passed to SDA software 400 via data path C 126, where it is further processed and logged as published statistical results 140 along with an accompanying historical record 145 of detectable events as shown in FIG. 1.

A SLIP detection, tracking and alignment feedback and control loop 628 of block 600 can be comprised of the following elements: a TEST stream timing alignment buffer block 605; a REF stream timing dynamic alignment buffer block 625; a correlator bank block 610; a correlator analysis block 615; a slip alignment analysis block 620; and a slip alignment feedback 626 data path. The feedback and control loop 628 that is formed by these elements drives "symbol wise alignment" of TEST stream 112 and REF data stream 106 by dynamically adjusting the depth of the buffering provided by the REF stream timing dynamic alignment buffer block 625. As used herein, "symbol wise alignment" refers to the measurable condition of a timing alignment between the TEST stream 112 and the REF stream 106. However, once such "symbol wise alignment" is measured, the term symbol wise alignment may also be used herein to refer to the act of bringing the timing of the TEST stream 112 and the REF stream 106 into alignment or "synchronization" with one another. In one embodiment, for every symbol that makes up the REF Stream 106, slip alignment analysis block 620 continuously monitors for an alternative depth of the REF stream timing dynamic alignment buffer block 625 that would bring the symbols of REF Stream 106 of into better agreement with the symbols of TEST Stream 112. Once TEST Stream 112 and REF Stream 106 are "synchronized", i.e., in "symbol wise alignment", they are designated as being correlated with one another. Details concerning elements that make up this feedback and control loop 628 are discussed in greater detail hereinafter.

TEST stream timing alignment buffer block 605 and REF stream timing dynamic alignment buffer block 625 together provide an adjustable depth buffer that can be configured via data path D 141. The timing alignment buffer blocks perform a first-in, first-out (FIFO) buffering action that can accommodate both jitter in the timing of TEST Stream 112 due to receiver symbol synchronizer performance and data rate changes that may be due to Doppler shifts should some of the elements in the RF path be in sufficient motion to alter the average data rate of TEST Stream 112, thereby avoiding discontinuities in data flow. Overall, the TEST and REF data streams will maintain the same average data rate. However, during receiver slips, the instantaneous data rates between the REF and TEST stream jump. FIFO action isolates the remaining firmware from the timing inconsistencies introduced by slips of receiver 115.

The REF stream timing dynamic alignment buffer block 625 works alongside TEST stream timing alignment buffer block 605 to bring TEST and REF symbol streams into agreement and essentially functions as a dynamically adjustable, depth FIFO buffer. One of the purposes of the REF stream timing dynamic alignment buffer block 625 is to account for differences in latency between the data transmitted directly from data source 105 to SDA 100 versus data from data source 105 which passes through the RF transmitter 110 and receiver 115 to SDA 100.

Once correlation has been achieved between TEST stream 112 and the REF stream 106, changes to the alignment due to receiver symbol slips are accounted for in REF stream timing dynamic alignment buffer block 625 by either increasing or decreasing the depth of the FIFO of block 625 by the number of symbols indicated by slip alignment feedback 626. Similar to other firmware blocks described herein, the overarching behavior of REF stream timing dynamic alignment buffer block 625 is controlled via data path D 141 by SDA software application 400.

In order to understand the system of multiple correlators of correlator bank block 610, it is first useful to understand the individual behavior of a single soft decision correlator as implemented within SDA 100. Thereafter, the description of the system of soft decision correlators will follow with a discussion of correlator bank block 610. As a part of the discussion, note the assumption that the data content of REF stream 106 is sufficiently random to support operation of SDA 100.

As discussed herein, a soft decision correlation process provides a measure of how well REF stream 106 and TEST stream 112 match. The process itself combines the hard decision REF stream 106 and the soft decision TEST stream 112 into a sequence of soft decision correlation scores. For every REF and TEST symbol pair ingested by a single soft decision correlator, the soft decision correlation process generates a single soft decision correlation score. The magnitude of the score indicates how well the sequences match. High absolute values indicate a higher degree of correlation between the streams, i.e. the sign bits between the streams are related to one another. Absolute values of correlation scores that are closer to zero indicate a low degree of correlation, i.e., the sign bits between the streams are random in relationship to one another. When REF stream 106 and TEST stream 112 are correlated, the sign of the correlation score indicates whether the polarity sense of REF stream 106 matches the polarity sense of TEST stream 112 or in the alternative, whether they are exactly opposite.

To examine exactly what SDA 100 is doing during the correlation process, a review of the equations powering the process will be discussed. Equation 1 represents a probability weighted sum-of-products correlation technique and describes implementation of the soft decision correlation process of SDA 100. In Equation 1. TEST data stream 112 is represented by a sequence t(n). Similarly, REF stream 106 is represented by the sequence r(n). The sequence c(n) represents the sequence of correlation scores generated by the correlation process. The value N is the window over which the correlation process is evaluated and is represented by the "correlation depth parameter" in the design of SDA 100. Reference is made to the following correlator equation as COR:

Equation 1

$$c(n) = \sum_{k=0}^{N-1} t(n-k)r(n-k) \quad \text{(Eq 1)}$$

Given the sequence of three bit soft decision data t(n) shown below (decisions are expressed in sign/magnitude convention where the "+" and "−" indicates the status of the sign bit), an example calculation of the soft decision correlation score is performed. For purposes of the example, let the correlation depth be set to 5 (N=5). This depth is an atypically small correlation window, but it will reduce the amount of math in the example for easier understanding. In the following example, the TEST sequence is time aligned with the REF sequence.

Correlation Example

REF and TEST Aligned with Matching Polarity Sense for Data $$t(n) = \begin{cases} +0, & \text{for } n < 0 \\ \{+2, +1, -3, +3, -1, +2, +0, -0, -2, +3, -2, ...\}, & \text{for } n \geq 0 \end{cases}$$

-continued $$r(n) = \begin{cases} +0, & \text{for } n < 0 \\ \{+1, +1, -1, +1, -1, +1, +1, -1, -1, +1, -1, ...\}, & \text{for } n \geq 0 \end{cases}$$

$c(0)=(+2*+1)+(+0*+0)+(+0*+0)+(+0*+0)+(+0*+0)$ $c(1)=(+1*+1)+(+2*+1)+(+0*+0)+(+0*+0)+(+0*+0)$ $c(2)=(-3*-1)+(+1*+1)+(+2*+1)+(+0*+0)+(+0*+0)$ $c(3)=(+3*+1)+(-3*-1)+(+1*+1)+(+2*+1)+(+0*+0)$ $c(4)=(-1*-1)+(+3*+1)+(-3*-1)+(+1*+1)+(+2*+1)$ $c(5)=(+2*+1)+(-1*-1)+(+3*+1)+(-3*-1)+(+0*+0)$

Thus $$c(n) = \begin{cases} +0, & \text{for } n < 0 \\ \{+2, +3, +6, +9, +9, +9, ...\}, & \text{for } n \geq 0. \end{cases}$$

For every c(n) that is evaluated, there are N multiplicative and N additive operations. One way of stating this result is c(n) comprises of a sum of product terms. The (+0*+0) product terms get pushed out of the correlation depth window starting with the c(0) summation. It can also be seen that until the $n^{th}$ value is as great as the correlation depth (N), the correlator produces results similar to the situation where the correlation depth is less than what is specified. Starting with c(0), the effective correlation depth is 1. For c(1), the effective correlation depth is 2. This result continues until c(4), where the effective correlation depth is finally 5 product terms, as specified. Thus, if one were making decisions based on the correlation results and some type of statistical average, the contribution due to a specific set of product terms from the REF and TEST sequence for (n<N−1) has greater significance when compared to the situation when (n≥N−1). SDA 100 handles this situation by refraining from making decisions regarding the correlation scores until all the correlators involved have reached their specified operational depth (n≥N−1). This behavior of waiting to "recharge" the correlators before using their resultant scores is controlled by a SLIP_RECOVERY_CYCLE parameter of SDA 100. Typically, the SLIP_RECOVERY_CYCLE is set to the same value as the correlation depth parameter (COR_DEPTH).

Another significant point of interest illustrated by the example above is that when the REF and TEST sequences are aligned in time, each of the product terms will contribute toward a positive sum for the correlation score. Any given product term in the correlation sum is the product of the REF sign bit and the TEST sign bit weighted by the TEST's soft decision value. Thus, it is possible to distinguish a situation wherein the streams are in alignment, but weighted with low TEST sequence soft decision values, representing a low level of confidence in the soft decision, from the situation wherein the streams are in alignment and the TEST sequence soft decision values are high, which represents a high level of confidence in the soft decision.

The following example below illustrates the anti-correlation situation regarding data polarity. Using the same values from the first example but with opposite polarity assigned to the REF sequence sign bits, each of the product terms contribute towards a negative sum for the correlation score. Notice the magnitudes for the correlation scores are the same for both the first and second examples. Thus, for aligned data streams a single correlation process can detect information regarding the polarity relationship between the REF and TEST sequences based on the sign of the correlation results. In both cases, the magnitude or absolute value of the correlation score provides an indication of how strongly the two sequences are in agreement.

Correlation Example REF and TEST Aligned with Opposite Polarity Sense for Data $$t(n) = \begin{cases} +0, & \text{for } n < 0 \\ \{+2, +1, -3, +3, -1, +2, +0, -0, -2, +3, -2, \ldots\}, & \text{for } n \geq 0 \end{cases}$$

$$r(n) = \begin{cases} +0, & \text{for } n < 0 \\ \{-1, -1, +1, -1, +1, -1, -1, +1, +1, -1, +1, \ldots\}, & \text{for } n \geq 0 \end{cases}$$

$c(0)=(+2*-1)+(+0*+0)+(+0*+0)+(+0*+0)+(+0*+0)$ $c(1)=(+1*-1)+(+2*-1)+(+0*+0)+(+0*+0)+(+0*+0)$ $c(2)=(-3*+1)+(+1*-1)+(+2*-1)+(+0*+0)+(+0*+0)$ $c(3)=(+3*-1)+(-3*+1)+(+1*-1)+(+2*-1)+(+0*+0)$ $c(4)=(-1*+1)+(+3*-1)+(-3*+1)+(+1*-1)+(+2*-1)$ $c(5)=(+2*-1)+(-1*+1)+(+3*-1)+(-3*-1)+(+1*-1)$

Thus, $$c(n) = \begin{cases} +0, & \text{for } n < 0 \\ \{-2, -3, -6, -9, -9, -9 \ldots \}, & \text{for } n \geq 0. \end{cases}$$

Next, the case where TEST data stream 112 and REF data stream 106 are not in alignment is considered. Since by definition the sequence of the reference sign bits are sufficiently random to support an RF communications system, if the REF and TEST sequences are not time aligned there will be on average an equal number of product terms in the calculation of correlation score sum of products that are positive and negative. On average the number of positive product terms matches the average number of negative product terms and the overall magnitude for the correlation scores summation remains low. The following example illustrates this situation by using the same values from the original example with a modification to the REF sequence's values such that roughly on average there is an equal number of REF and TEST sequence values that agree and that disagree in sign bit polarity.

Correlation Example REF and TEST Aligned with Opposite Polarity Sense for Data $$t(n) = \begin{cases} +0, & \text{for } n < 0 \\ \{+2, +1, -3, +3, -1, +2, +0, -0, -2, +3, -2, \ldots\}, & \text{for } n \geq 0 \end{cases}$$

$$r(n) = \begin{cases} +0, & \text{for } n < 0 \\ \{+1, -1, -1, -1, -1, -1, +1, -1, -1, -1, +1, \ldots\}, & \text{for } n \geq 0 \end{cases}$$

$c(0)=(+2*+1)+(+0*+0)+(+0*+0)+(+0*+0)+(+0*+0)$ $c(1)=(+1*-1)+(+2*+1)+(+0*+0)+(+0*+0)+(+0*+0)$ $c(2)=(-3*-1)+(+1*-1)+(+2*+1)+(+0*+0)+(+0*+0)$ $c(3)=(+3*-1)+(-3*-1)+(+1*-1)+(+2*+1)+(+0*+0)$ $c(4)=(-1*-1)+(+3*-1)+(-3*-1)+(+1*-1)+(+2*+1)$ $c(5)=(+2*-1)+(-1*-1)+(+3*-1)+(-3*-1)+(+1*-1)$

Thus $$c(n) = \begin{cases} +0, & \text{for } n < 0 \\ \{+2, +1, +4, +1, +2, -2 \ldots\}, & \text{for } n \geq 0. \end{cases}$$

In an alternate embodiment, an additional correlator configuration may be used. The configuration is a variation of the correlation process described by Equation 1 and can be used for accommodating cases where the receiver may invert the sign for every other soft decision value that is a part of the TEST stream sequence. Referring back to FIGS. 5 and 6, a situation can arise wherein a SQPSK receiver or a QPSK receiver locks to the transmitted signal in such a way as one of the two channels has different soft decision sign bit polarity assigned and the two channels provided by the SQPSK receiver are not being used independently from one another, i.e., the two channels are multiplexed into a single stream. Regardless of whether TEST stream sequence 112 contains values with all positive sign polarity sense, all inverted sign sense, every other soft decision sign sense inverted, or alternatively the "other every other" sign sense inverted, SDA 100 tracks the timing alignment between REF stream 106 and TEST stream 112. For the first two cases, all sign bits with the positive polarity sense or all sign bits with a negative sign polarity sense are tracked by correlators described by Equation 1. These types of correlators may be termed as "COR" herein.

The term "XCOR" is used to describe the correlator described by Equation 2. For an XCOR correlator, the bit sense assignments of the product terms is dithered by the $(-1)^k$ term and will cause the magnitude of the correlation scores to grow large and positive (correlation) when every other sign bit from the sequence of TEST data stream 112 is flipped and large and negative when the "other every other" sign bit is flipped (anti-correlation). Like the COR correlator, if the sign bits between TEST stream 112 and REF stream 106 have a random relationship, the magnitude produced by the XCOR correlator remains relatively low on average, as indicated by the expression:

$$c(n) = \sum_{k=0}^{N-1} (-1)^k t(n-k) r(n-k) \qquad \text{Equation 2 (Eq2).}$$

In summary, the COR and XCOR type correlators make it possible to determine if a given sequence relationship between the TEST and REF sequence are aligned or unaligned. In addition, when the streams are aligned, the correlators produce polarity information regarding the way the receiver has assigned the polarity of the TEST stream's soft decision sign bit in relation to the REF stream's sign bit. Given these characteristics of a single correlator, a system of correlators operating concurrently can provide more insight into the alignment relationship between TEST stream 112 and REF stream 106.

Correlator bank block 610 performs a soft decision correlation operation with multiple versions of the REF Stream 106 (with each version of the REF stream 106 being in a differing symbol alignment with TEST Stream 112 using the COR and XCOR correlators described above). Each of these independent correlation operations, by having differing symbol alignment, offer the possibility of detecting a slipped symbol in TEST Stream 112 as a result of receiver 115 slipping during data transmission. In addition, since SDA 100 can accommodate QPSK and SQPSK receivers, there is the possibility that TEST Stream 112 will be received with every symbol oriented in a positive logic sense, every symbol oriented in a negative logic sense, every other symbol oriented in a negative logic sense and finally, the other every other symbol oriented in a negative logic sense. In order to detect these alternating symbol logic conditions, REF Stream 106 is also correlated against a version of TEST Stream 112 with all possible logical sense inversions. Thus, one output of correlator bank block 610 is to provide multiple correlation results 612, one of which will be higher in magnitude than all the others, signifying that it closely matches the various aligned and logic sense versions of REF stream 106, for input to the correlator analysis block 615.

Individually a single COR or XCOR correlator only tells if the sequences being processed are time aligned or not time aligned. An individual correlator reveals no information regarding the amount or direction to shift the REF sequence relative to the TEST sequence if they are not time aligned. To determine the amount and direction of shift. SDA 100 employs a system of soft decision correlators running concurrently.

Figure 8:
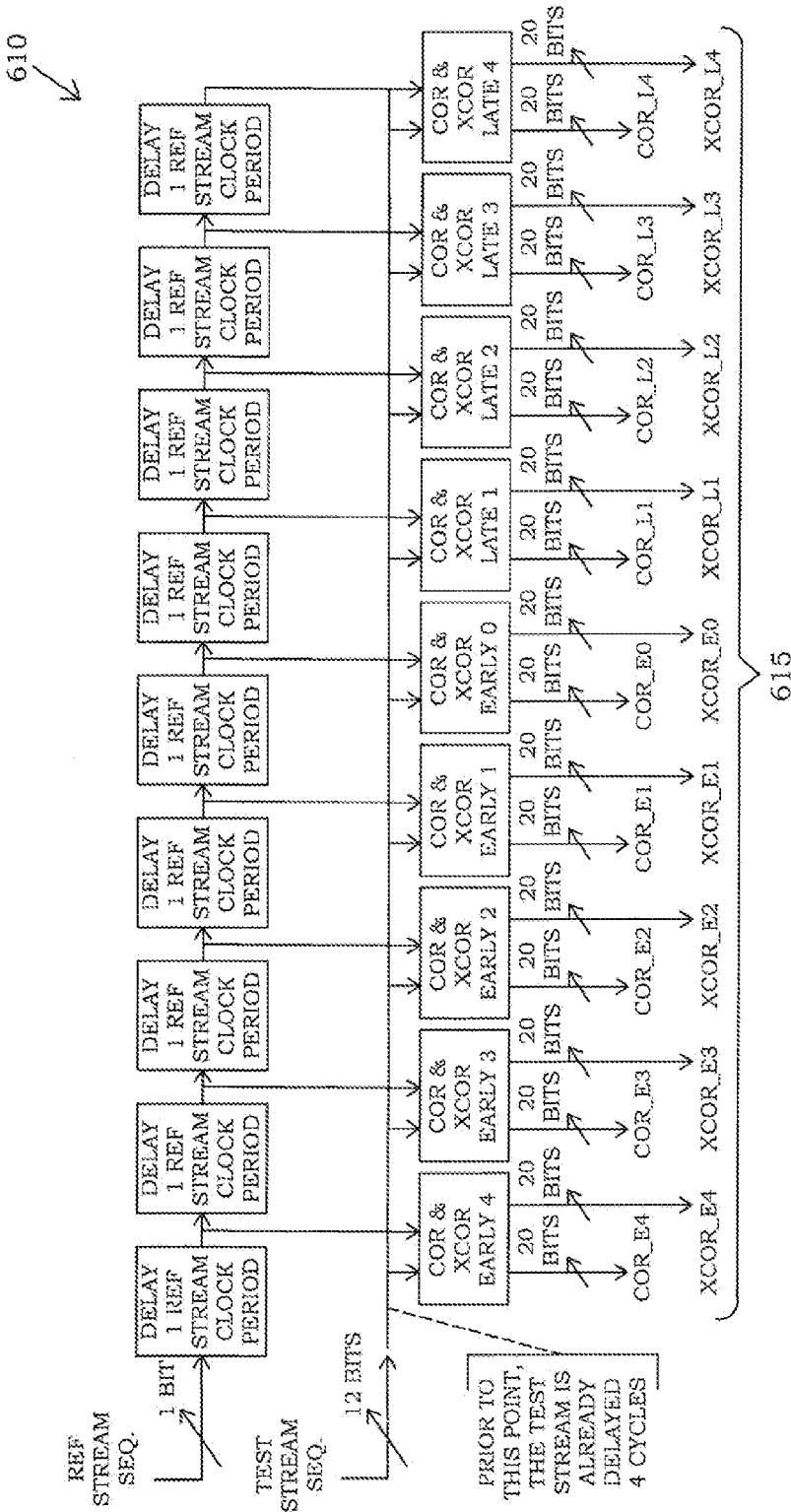
FIG. 8 is a block diagram of the correlator bank block portion of the soft decision analyzer in accord with one possible embodiment.

Results from correlator bank 610 are used to determine when and how far to shift TEST sequence 112 so as to bring REF stream 106 into a time aligned relationship, also referred to herein as "synchronized" or "symbol wise alignment", between TEST sequence 112 and REF stream 106. FIG. 8 depicts a system of correlators 610 that operate concurrently to yield information regarding the timing relationship between TEST stream 112 and REF stream 106. The correlator bank block 610 is operable to detect "symbol wise alignment", which in at least one embodiment also refers to the measurable condition related to the degree of timing alignment between the TEST stream 112 and the REF stream 106. The term "symbol wise alignment" may also be used to refer to the bringing of the timing of the TEST stream 112 and the REF stream 106 into an exact time aligned relationship, i.e., an exact one-to-one symbol wise alignment with one another or "synchronization." Accordingly, the correlator bank block 610 may be utilized for detecting and measuring "near" symbol wise alignment, the measurement of which depends on the number of correlators utilized in the correlator bank block 610. For example, with effectively nine correlators in the bank block 610 of FIG. 8, a measurement of near symbol wise alignment for asynchronous data streams might comprise a measurement of difference from exact one-to-one alignment of from one to eight symbols. Of course, the correlator bank block 610 is also operable to detect an exact one-to-one symbol wise alignment wherein each TEST stream 112 symbol and each REF stream 106 symbol is exactly aligned in time with each other (i.e., synchronized). Ultimately, results from correlator bank block 610 are processed by modules downstream to make adjustments to the timing relationship between TEST stream 112 and REF stream 106 after detection of "near symbol wise alignment" rather than "exact one-to-one symbol wise alignment" between the two streams is detected. The focus of correlator bank block 610 is to produce a set of raw correlation score results that can be used by downstream modules to drive timing alignment corrections between the two streams, thereby tracking slips that occur during operation of SDA 100.

Each of the nine correlator blocks depicted in FIG. 8 contain both a COR type correlator and a XCOR type correlator. In one embodiment, 18 correlators run concurrently in SDA 100 in different time windows. In an alternate embodiment, a greater number of correlators could run, and in yet another embodiment, a number less than 18 correlators could run simultaneously. In FIG. 8, the nine different correlator blocks feed different timed versions of the REF sequence, and the TEST sequence has already been delayed by 4 units. The correlators along with their specific delayed version of the REF sequence are named for the timing relationship they are configured to detect. For example, "COR_E4" is configured to detect the situation where the REF sequence is four samples ahead ("E" for early) in the sequence progression. The correlators devoted to the detection of aligned relationship are indicated by "COR_E0" and "XCOR_E0". Any correlators configured to detect situations where the REF sequence lags the TEST sequence are signified with a "L1" through "L4" designation ("L" for lagging).

The specified depth of the correlation process directly affects the amount of processing required for each of the correlators, both COR and XCOR correlators, and can permissibly range from 5 to 1024 by the COR_DEPTH parameter for the design of SDA 100. Utilizing the brute force approach for when the correlation depth is set to 1024, together with equation 1 and 2, implies there are 1024 multiplications and 1024 additions required for the COR correlator and 1,536 multiplications and 1024 additions for the XCOR correlator required for every REF clock period. Granted, the multiplications are fairly trivial because all the product terms involve multiplication by +1 or −1. Since Correlator Bank 610 is made up of 9 individual COR/XCOR pairs, the actual requirement for Correlator Bank 610 is 9 times that of an individual COR/XCOR pair. This computation comprises 23,040 multiplications and 18,432 additions per REF stream clock period. Thus, if SDA 100 is operating at a data rate of 50 Mbps, an amount of computations equivalent to a maximum of $1.152\ E+12$ multiplications per second combined with a maximum of $921.6\ E+9$ additions per second is performed in order to produce 18 twenty bit vectors in correlator bank block 610 which are passed to the next step in the process: correlator analysis block 615 ("RANK").

Even though much of the processing is being performed in hardware, over $1.152E+12$ operations per second is a significant number of computations. The amount of operations required explains why the internal representation of the TEST sequence's soft decision values was selected to be in a sign magnitude format-it is due to the sheer numbers of multiplications that involve +1 and −1-consequently sidestepping lots of two's complement operations. Attempting to make this number of two's complement conversions can be expensive and difficult to achieve efficiently.

Returning now to FIGS. 4A and 4B again, changes to the data due to perturbations in the demodulation of receiver 115 are known as "constellation rotations." When receiver 115 experiences a slip or rotation, the correlator that was previously generating the highest value, indicating it best matched the data content of TEST stream 112, will diminish and a new correlator will increase to become the highest value. Correlation results 612 is produced by each of the correlators in the bank for every symbol of REF stream 106 and TEST stream 112 that is evaluated. Characteristics of the correlation operation are driven by SDA Software 400 via data path D 141 and can be used to markedly change the data depths of the individual correlators, thus allowing SDA 100 to be tuned to a wide variety of testing objectives.

Correlator analysis block 615 performs a rapid sort in SDA firmware 300 of all the multiple correlator results provided by correlator bank block 610 in order to identify a single specific winning correlator, i.e. the correlator with the highest value.

This sorting process occurs for each REF/TEST symbol stream combination that is evaluated. The single winning correlator result 616 is passed to slip alignment analysis block 620.

Figure 9:
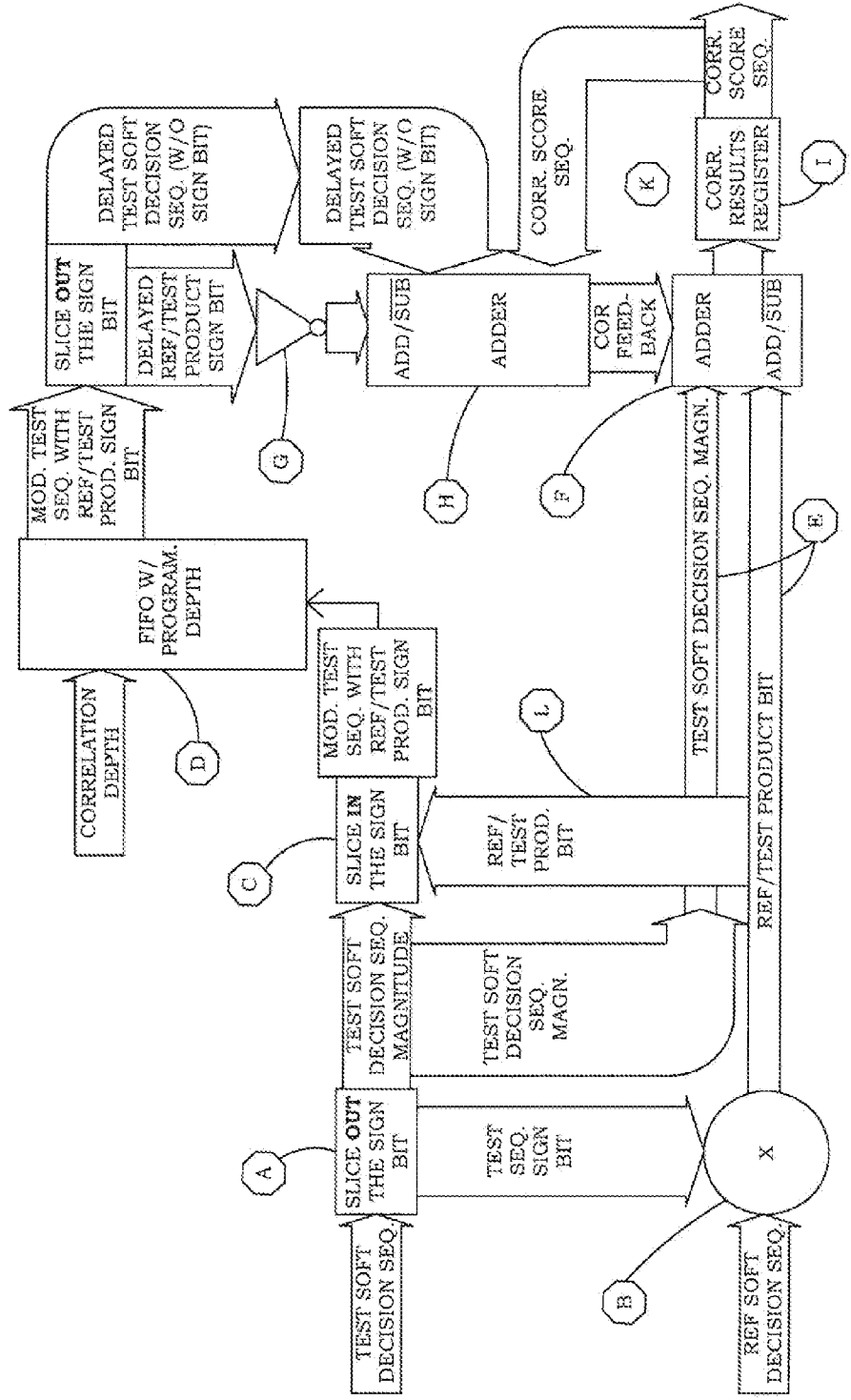
FIG. 9 is a block diagram of a single correlator in the correlator bank block portion of the soft decision analyzer in accord with one possible embodiment herein.

The process for construction of the correlation score of SDA 100 is illustrated in more detail in FIG. 9. As viewed on this sheet, the REF and TEST stream sequences enter on the left side of FIG. 9 and the resultant correlation score sequence exits to the right. First, the process slices the sign bit out of test stream sequence 106 to be used in the calculation of a product term A. TEST sign bit and REF sign bit are then multiplied (Label B) and the results (REF/TEST Product) used in two different places. The first use of the REF/TEST Product is to slice it back together into TEST stream's magnitude sequence C. The newly formed TEST sequence with REF/TEST product sign bit is stored in FIFO buffer D that has a programmable depth feature. The programmable depth essentially controls the amount of delay from when the data enters and leaves FIFO D. The second use of the REF/TEST Product is to store the Product Terms Sum E, similar to the calculation of the correlation score described hereinbefore.

REF/TEST product determines if the new product term is added or subtracted (Label F) from the ongoing calculation stored in the correlation score register (Label I). The adder at Label F adds or subtracts the introduction of new product terms with the Correlation Feedback sequence (Label K). The correlation feedback sequence represents the previous correlation score summation minus the product terms (outputs from the FIFO) that are rolling out of the correlation score summation window. Inverter G ensures that when a product term is added at Step F to the correlation score, after the FIFO delay, that same product term is subtracted from the correlation score by Subtractor H. The net effect is the calculation of the correlation score sequence without all the redundant calculations required to implement the brute force implementation of Equations 1 and 2.

Utilizing the concepts illustrated in FIG. 9 drops the computational requirements of SDA 100 considerably in comparison to the brute force method. When the correlation depth is set to 1024, the design concept illustrated in FIG. 9 implies 1 multiplication and 2 additions required for the COR correlator and 2 multiplications and 2 additions for the XCOR correlator, both on a per REF clock period basis. Thus, for a COR/XCOR pair there are 3 multiplications and 4 additions per REF clock period basis. Because of the storage provided by the FIFO, it is not necessary to recalculate all the intermediate product terms for each correlation score sequence value. Thus, the actual depth of the correlation has no bearing on the number of multiplications or additions for each correlation score sequence element (unlike the brute force method).

However, similar to the brute force calculation, there remains the need to multiply the individual COR/XCOR pair combination's requirements by 9 to determine the requirements for the entire correlation bank. That computation would be 27 multiplications and 36 additions per COR/XCOR pair on a REF stream clock basis. If SDA 100 is operating at a maximum certified data rate of 50 Mbps, there are an equivalent of a maximum of 1.35E9 multiplications per second and a maximum of 1.8E9 additions per second in order to produce 18 twenty bit vectors in correlator bank 610, which are passed to the next step in the process, correlator analysis block 615 (RANK).

In summary, using the brute force approach to implement the correlation score sequence maximally requires roughly 2.07E+12 operations. Using the approach of SDA 100 as outlined in FIG. 9 maximally requires 3.15E+9 operations. Thus the process of SDA 100 for calculating the correlation score sequence represents a savings of three orders of magnitude over the amount of effort expended for the brute force approach.

The next step in the process is to reduce the 18 concurrently generated 20 bit correlation vectors into a single winning correlation score. This step of reduction takes place in a RANKING module (RANK for short) of SDA 100. Basically, SDA 100 performs a hardware equivalent of a multistage sort to identify the single correlator that has the highest correlation magnitude score. This sorting process takes place once for every REF sequence element processed (i.e., once every REF clock period). In addition to the 18 sorted correlation vectors, correlator analysis block 615 introduces a faux correlation that can be used to squelch correlator magnitude results from correlator bank block 610 that fall below a specified threshold (COR_QUAL_THRESHOLD). Winning correlations whose magnitude is less than the quality threshold value are suppressed from counting towards the criteria used to declare a detected slip. If one has no desire to squelch low magnitude correlation results, the COR_QUAL_THRESHOLD parameter may be set to zero.

Even though each correlator can have up to $2^{19}$ possible different magnitude values, there are circumstances that happen frequently enough wherein the issue of a magnitude tie between the different correlators should be taken into account. Several factors influence this "tie" issue. The factors include correlation depth, TEST Stream soft decision width, and the signal to noise ratio (SNR) at the input of the receiver. During development of SDA 100, it was noticed that the occurrences of ties, which initially did not seem all that relevant, ended up being statistically significant. For example, in situations where the receiver presents a small number of soft decision bits, the correlation depth is shallow and the SNR is strong (i.e. the TEST stream soft decision magnitudes tend to be similar), the correlation scores exhibit less variation, thus enhancing the probability of a tie. Another situation that can arise where the resolution of the tie becomes relevant is when SDA 100 is used to evaluate a QPSK system and the receiver experiences a channel swap event. At each stage in the sort process and in the event of a correlation score magnitude tie, the mechanics of the sort tend to favor the results of one correlator over another. Selecting which correlator is compared to another correlator turns out to be useful in minimizing the effects of this tie phenomenon.

The first stage comparisons evaluate the COR correlation scores against the XCOR correlation scores for a given COR/XCOR pair, with a tie resolving in favor of the COR results. In this initial stage, SDA 100 minimizes the effects of the tie priority bias by comparing the results from a COR/XCOR pair because both the COR and XCOR in the pair experience the exact same REF and TEST data stream data. For example, COR_E1 is initially compared to XCOR_E1. Since the COR/XCOR pair are fed the same delayed version of the REF sequence and TEST sequence, this step minimizes the chance for ambiguous results (i.e. a correlation score magnitude tie). Half the sign bits involved in the calculation of the correlation score summation will by definition result in correlation product terms that decrease the correlation score results for either the COR or XCOR in a given COR/XCOR pair. The result depends on the polarity assignment made by the receiver to the TEST stream's soft decision sign bit. More specifically, if the receiver has assigned TEST stream soft decision sign bit polarity to quadrants I and III (Examples (1) and (4) of FIG. 5) or quadrants II and IV (Examples (2) and (3) of FIG. 5). In order for a tie to result at stage 1 of the sort process (where the bias would assert), exactly every other TEST stream's sign bit would also have to be in error (a low probability as long as the correlation depth is sufficient). Thus, at this first stage, it would take a strange coincidence for a COR/XCOR pair to generate a tie, minimizing the effect of the bias.

In this embodiment, the on time correlators, COR_E0 and XCOR_E0, have priority over all the other correlators in the resolution of a tie. The reasoning behind this approach is that if there is a chance the on time correlations are still valid, it may not be desirable to signal the potential of slip to downstream SDA modules. In one embodiment, a priority can be given to a correlator when there is a tie in correlation score magnitudes. Subsequent stages of the sort process favor correlators closer to the ideal alignment over correlators further from the ideal alignment (E0). For example, XCOR_L2 is favored in the event of a tie over COR_E3 because XCOR_L2 is closer to the ideal on time correlator and requires a smaller correction. In the event there is a tie for the subsequent stages, SDA 100 favors the correlators associated with the smallest correction. Favoring large slips over small slips could potentially introduce unstable response in the alignment correction process, especially in the case of dealing with QPSK channel swapped conditions.

Winning results from correlator analysis block 615 are finally passed to slip alignment analysis block 620 that is responsible for adjusting the timing relationship between REF stream 106 and TEST stream 112 and for accumulating statistical information regarding slips and rotations. Correlator analysis block 615 passes several pieces of information regarding the winning correlator to slip alignment analysis block 620. Block 615 identifies which correlator produced the winning score. Then block 615 passes the magnitude of the winning score and the sign of the winning score. A winning correlator is identified for every REF sequence value that is passed to correlator analysis block 615 from upstream, which is usually once every REF clock period.

Slip alignment analysis block 620 performs trending analysis upon the sequence of winning correlation results in order to determine if the receiver has experienced a data slip or constellation rotation. If a change over the previous winning correlator persists for a number of symbol cycles specified by SDA software 400, slip alignment analysis block 620 declares a slip or rotation. Upon detection of a slip, slip alignment analysis block 620 issues feedback via block 626 to buffer block 625, which in turn is used to control the alignment of REF stream 106 and TEST stream 112, thus bringing the respective streams back into alignment. In addition, block 620 statistically tracks the magnitude and direction of slips and the number of rotations and provides this data 622 as part of the aggregate of statistical information 126 to SDA Software 400.

Slip alignment analysis block 620 processes the output from correlator analysis block 615 and is primarily responsible for driving the buffer depth relationship that controls the timing alignment between the TEST data stream 112 and REF stream 106. In addition, block 620 is the module that begins the collection of statistical data regarding the performance of the receiver under test. Slip alignment analysis block 620 also tracks the slips and rotations and the relationship of their feedback to the stream buffers.

Correlator analysis block 615 only resolves correlator magnitude tie situations associated with a single REF sequence clock period (resolving ties that happen within the same REF cycle clock period). A tie situation can also arise when examining consecutive REF sequence clock periods, thereby requiring SDA 100 to resolve the issue across multiple consecutive REF cycle clock periods. Generally, in the event of a tie between two winning magnitudes, SDA 100 favors the correlator that was associated with the first occurrence of winning magnitude. The rationale behind this approach is that when a tie occurs, there is no way to know which correlator really deserves to win, because a tie is ambiguous. In one embodiment, the approach is essentially to do nothing until there is clear evidence on which to base a corrective alignment action. There is an exception to this approach of preferring the first occurrence. The exception is when there is a tie between either of the on time correlators (COR_E0 or XCOR_E0) and any of the other correlators (E4-E1 and L1-L4). In this circumstance, the tie is resolved in favor of the on time correlators.

The next step taken by slip alignment analysis block 620 is to make a determination whether there has been a real slip in between REF stream sequence 106 and TEST stream sequence 112. The declaration of a slip is made when there have been a number of consecutive winning correlation magnitude scores from the same correlator that are not one of the on time correlators (E0). This contest for determining if there has been a slip is illustrated by the flow diagram of FIG. 10. The number of required consecutive winning correlation magnitude scores is controlled by the SLIP_THRESHOLD parameter. If one of the on time correlators (E0) is the winner of this consecutive count process, then no action is required to realign the buffer relationship between the REF and TEST streams. However, if one of the other correlators (E4-E1 or L1-L4) wins this consecutive count contest, a slip is declared and SDA 100 begins its slip recovery process.

Figure 11:
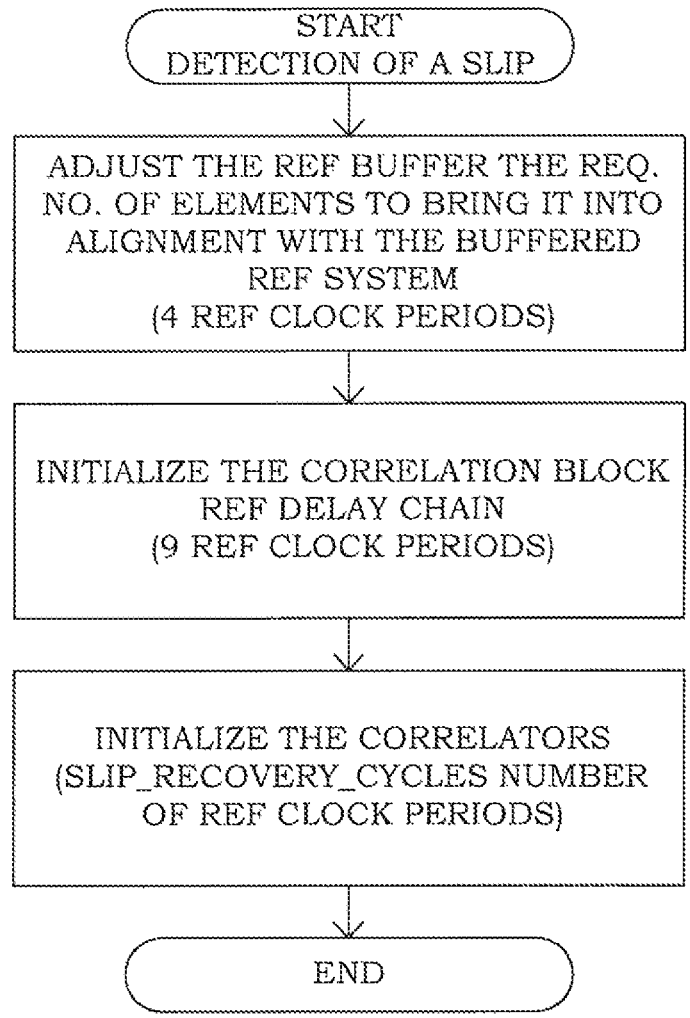
FIG. 11 is another diagram depicting the steps involved in the slip recovery process of the firmware of the soft decision analyzer in accord with another embodiment herein.

Finite state machines within slip alignment analysis block 620 drive the buffer re-alignment process after the detection of a slip. A flow diagram illustrating this process of slip recovery together with the associated delays is shown in FIG. 11. In one embodiment, the first step that slip alignment analysis block 620 takes after detecting a slip is the step of adjusting the depth of the buffer used to control the timing of REF stream data. The specific winning correlator that won the consecutive count contest drives the direction in which the REF buffer should be adjusted along with the magnitude of the buffer adjustment. SDA 100 only deals with one slip at a time but the slip can range anywhere from one to four REF stream symbols in either the forward or reverse direction relative to the TEST stream. When SDA 100 detects a slip, a slip recovery process begins realigning the buffers and re-initializing all the correlators. Upon exit of the slip recovery process, if there has been another slip, SDA 100 will detect it as soon as the associated slipped correlator wins the consecutive count contest. During the slip recovery process, other parts of SDA 100 continue to function (for example the clock phase detectors) without altering their behavior.

Slip recovery is a multi-step process and is illustrated by the flow diagram shown in FIG. 11. The first step in the slip recovery is to adjust the buffer relationship between REF stream 106 and TEST stream 112. This adjustment is made during the course of four REF clock bit periods. In one embodiment, four REF clock bit periods are utilized even if SDA 100 only needs to make a one symbol correction. The second step is to initialize the chain of delayed REF values within correlator block 610, which for this embodiment takes nine REF clock bit periods. The next step is to initialize (recharge) the contents of the correlators. The number of REF clock cycles necessary to initialize the correlators is specified by the SLIP_RECOVERY_CYCLES parameter. As previously explained herein, this parameter is typically set to the same value as the correlation depth. After correlator bank 610 is recharged with new data to the depth specified by the COR_DEPTH parameter, slip alignment analysis block 620 exits the slip recovery process and resumes the search for slips.

The slip detection and recovery processes limit SDA 100 from detecting slip events that are closely spaced in time. To calculate the minimum spacing of slip events that SDA 100 can detect in seconds, sum the SLIP_THRESHOLD and SLIP_RECOVERY_CYCLES parameters, add 13 cycles (4 cycles for buffer relationship adjustment and 9 cycles for re-initialization of the REF delay chain) and multiply the combined sum by the REF clock period and take the ceiling of the result. For example, using a COR_DEPTH=128, SLIP_THRESHOLD=50, SLIP_RECOVERY_CYCLES=128, and a REF Clock rate of 2 Mbps, the minimum spacing between slip events that SDA 100 can detect is 96 μs.

Clock phase detector block 630 provides an alternative method to detect receiver slips over the method of correlating the data content of the REF and TEST symbol streams. It provides insight into the receiver's behavior independent of data content and instead relies on a direct comparison of clock edges present in TEST data stream against clock edges present in the REF Stream 106. This alternative method is useful in characterizing performance of a RF receiver's bit sync tracking circuitry and provides a means to determine if portions of the receiver are working properly regardless of whether the receiver presents TEST Stream 112 data correctly. The direct comparison of the clock edges produces a more agile detection of slip conditions than the data correlation method used by SDA 100 embodied by correlator bank block 610 and associated slip alignment feedback and control loop 628. Such capability especially proves useful in measuring statistical performance of receiver acquisition when an RF receiver first starts the process of acquiring an RF signal. This feature is utilized in acquisition testing. Block 630 also provides clock edge based phase slip performance information 631 as part of the aggregate of statistical information 126 to SDA software 400.

The performance of a receiver is affected by the length of consecutive symbols that are ones or zeros. Thus, there exists a need to measure the run length characteristics of REF stream data 106 provided by data source 105. TEST stream run length analysis block 635 measures run lengths and publishes run length performance results 636 to statistical histogram analysis block 650. Statistical histogram analysis block 650 accumulates individual run length events into a histogram format. The individual breakdown of the run length data events as provided by TEST stream run length analysis block 635 is suitable for interpretation in the context of BPSK, QPSK and SQPSK communication systems.

In addition, TEST stream run length analysis block 635 also provides a means to trigger external test equipment upon the detection of run length events that exceed a threshold as configured by SDA software application 400 via data path D 141. A run length trigger threshold signal 665 is one of many selectable internal SDA signals that may be directed to signal conditioning hardware 200 for buffering and potential monitoring by external test equipment such as logic analyzers or oscilloscopes.

The bit error detector block 640 provides a hard decision bit error measurement on the correlated REF symbol stream 611 and correlated TEST symbol stream 621. Block 640 is capable of performing long bit error rate tests (BERT) that extend over multiple days, compiling up to 10E13 symbols of data. Block 640 automatically applies proper adjustment to symbol polarity based on the quadrant of operation as determined by SLIP alignment analysis block 620 for BPSK, QPSK and SQPSK-based receivers. Block 640 also tracks TEST stream 112 errors for the one or zero symbols separately, as well as separately tracking the number of symbols in the REF stream that are ones and zeros. Statistical imbalances for TEST stream 112 in the frequency between symbols that are one errors and symbols that are zero errors can expose problems with receiver performance. Statistical imbalances for REF stream 106 in the number of symbols that are ones and symbols that are zeros provide a measure of suitability of data source 105 to provide data to a TEST configuration. If desired, bit error detector block 640 does not process symbols during the period where slip alignment analysis block 620 is making adjustments to the alignment of TEST and REF Stream symbol alignment. Instead, in one embodiment, block 640 resumes its accumulation of BERT data once the two data streams 106 and 112 have been brought back into alignment. During the accumulation of BERT data, block 620 tracks whether there has been a slip or rotation during a TEST interval. The bit error rate test (BERT) is used to control the sampling interval for the accumulation of statistical data by the historical event recorder block 655. Thus, BERT can be correlated with slip rates and constellation rotation rates. Block 640 supplies bit error rate analysis information as part of correlated hard decision bit error performance data 641 and as part of the aggregate of statistical information 126 to SDA software application 400.

The primary function of statistical histogram analysis block 650 is to provide a means to statistically process millions of soft decision symbols data in a way that is useful in the analysis of communications systems. Block 650 operates in several configurations as commanded by SDA software application 400 via data path D 141. Statistical histogram analysis block 650 is responsible for processing the synchronized and scaled, but uncorrelated, TEST stream soft decision data 541 as it is supplied by the output of synthetic channel and scale block 540. This mode of operation for statistical histogram analysis block 650 is known as the RAW mode. During initial setup of SDA 100 in a test configuration with devices under test, viewing the soft decision data as first interpreted by process raw input block 520 may be of interest because there are lots of opportunities for issues when connecting the numerous digital signals between the receiver 115 and SDA 100.

Selective application of functions performed by the process raw input block 520 and the synthetic channel and scale block 540 can be used to detect and correct issues related to the physical interface between the digital systems. The applications include detection and correction of the soft decision bits that have been mis-wired, detection and correction of data polarity issues for individual soft decision bits, identification and mitigation of stuck soft decision bits, and the mapping between different mathematical formats used to express the value of soft decision symbol data. When statistical histogram analysis block 650 is operating in the RAW mode, it publishes the resultant histogram performance data 651 to SDA Software application 400 as a part of the aggregate of statistical performance data 126.

A second mode of operation of SDA 100 and block 650, referred to as CORRELATED mode, provides a means to sort TEST stream soft decision data 531 and 541 based on correlated REF Stream symbol data into different histogram categories. This mode of operation produces useful results when SDA 100 has achieved the "correlation-locked" condition. Correlation-locked occurs when the REF stream 106 symbols and TEST stream 112 symbols are synchronized in time with one another and is declared by SLIP alignment analysis block 620. The ability of histogram analysis block 650 to sort TEST soft decision symbols based on the correlated REF symbol values into different category histograms allows SDA 100 to characterize performance attributes of RF receiver 115 under test for a given RF link condition. The performance attributes include, but are not limited to: receiver perceived signal to noise ratio, receiver perceived signal level, low density parity check (LDPC) combining ratio, transition interference, inter-symbol interference, inter-channel interference, decision threshold imbalance and channel imbalance. When statistical histogram analysis block 650 is operating in the CORRELATED mode, block 650 can be used to publish the resultant statistical histogram performance data 651 to SDA software application 400 as a part of the aggregate of statistical performance data 126.

Historical event recorder block 655 provides a means for SDA firmware 300 to log the occurrence of significant SDA events to SDA software application 400 where events are documented into historical records 145. Individual events of interest as determined by SLIP alignment analysis block 620 and clock phase detector block 630 are gathered into combined event record 656 and passed to SDA software 400 as a part of the aggregate of statistical performance data 126 via data path C. In addition, historical event recorder block 655 has a number of general purpose external inputs 623 that allow historical record 145 to make note of the occurrence of external events. This function provides a means to mark in the sequence of historical records the occurrence of any external events independent of SDA 100. One example of this type of occurrence is the event of performing an antenna switch. This function enables SDA 100 to assist the filtering of historical record 145 so as to locate relevant events of interest when developing and testing a communication system.

Acquisition test coordinator block 660 is used when statistically determining the time required for receiver 115 to lock to RF signal 111. Block 660 automates acquisition testing by controlling various SDA firmware components via data path R. The automated control of these components by acquisition/control data 661 via data path R is somewhat redundant with the control exerted on the same firmware components by SDA software 400 via data path D 141. The separate control data 661 is exerted in a cooperative fashion with the control exerted by software 400 because, in this embodiment, SDA software 400 is not fast enough by itself to control features during acquisition testing. Control of the acquisition test coordinator block 660 is managed by configuration/control data 141 via data path D. Acquisition test results 662 are aggregated into the statistical performance test data 126 communicated to SDA Software 400 via data path C.

Figure 12:
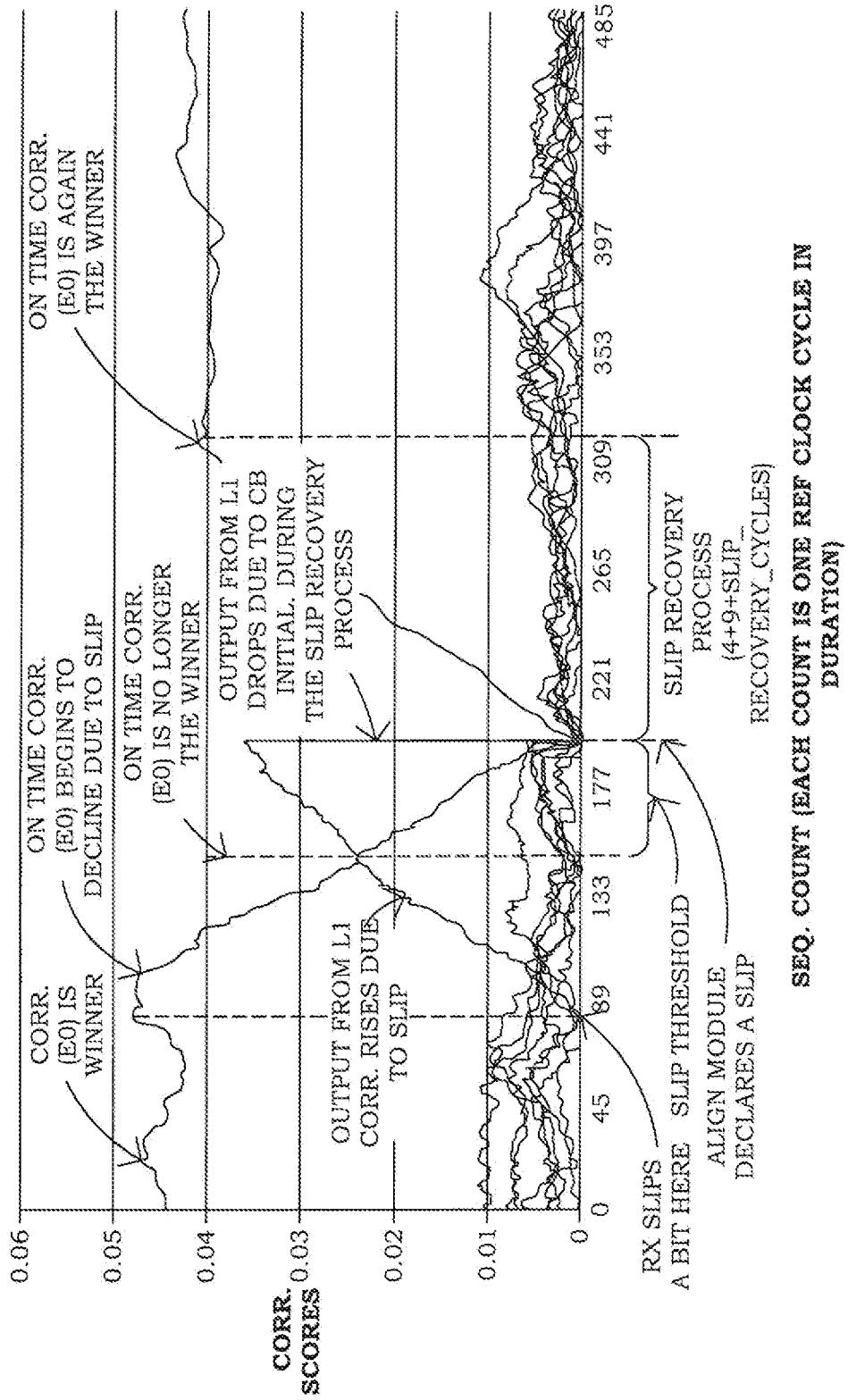
FIG. 12 is a diagram depicting representative output of the firmware of the soft decision analyzer in accord with another embodiment.

FIG. 12 shows a diagram of the graphical output of correlator bank block 610 for understanding the different parts to the slip tracking process of SDA 100. The traces that are depicted are the output from a logic analyzer that was used to monitor the output of correlator bank block 610. In this example, not all the correlators have their outputs depicted in the diagram (given that the logic analyzer ran out of inputs to hook up). However, enough inputs were connected to monitor the outputs of a little more than half of the correlators. Notice that at sequence count 1, there are many outputs of correlator bank block 610 which are approximately at or below a value of 0.01. These values represent the correlators that are not time aligned with the TEST stream and hence the output is relatively low. The single output of the on time correlator clearly stands out from all the other correlator scores because at this point it is being fed TEST and REF sequence data that is time aligned.

Sometime around sequence count 80, the receiver 115 experiences a one bit slip. Immediately upon the slip, the magnitude of the on time correlator begins to decline and the magnitude of the L1 correlator begins to increase. At approximately sequence count 140, the magnitudes for the two higher scoring correlators cross. The L correlator is now the winning correlator and, as shown, its consecutive winning streak persists. Because the streak persists for the number of REF clock cycles specified by the SLIP_THRESHOLD parameter, the state machines in slip alignment analysis block 620 declare a detected slip and begin the slip recovery process (at around sequence count 200). Initially during the slip recovery process, all the correlators are initialized to zero, resulting in the precipitous drop for the output of the L1 correlator. However, shortly after the initialization we can see the on time correlator is again gaining in strength because the correction applied to the timing relationship was correct.

During the slip tracking process, slip alignment analysis block 620 collects statistical information regarding the occurrence of slips and rotations for the system under test. The statistical information regarding the occurrence of slips and rotations 622 is provided to SDA software 400 for reporting performance of the device under test to the user interface and for recording to a journal file for later post test analysis. Results from slip alignment analysis block 620 are provided to other SDA modules (not shown) that determine if SDA 100 is tracking the timing alignment of the REF stream to the TEST stream (i.e., the COR LOCK parameter). Additionally, slip alignment analysis block 620 provides receiver constellation assignments to the hard decision bit error detector block 640 of SDA 100. Thus, the hard decision bit error block 640 can run continuously, even in the event of a slip or constellation rotation. In one embodiment, the constellation assignment is provided to the histogram module and allows the histogram module to categorize the receiver's TEST stream soft decision symbols into eight different histogram categories. The statistical information captured by these eight different categories provides insight into the soft decision performance of receiver 115.

Figure 10:
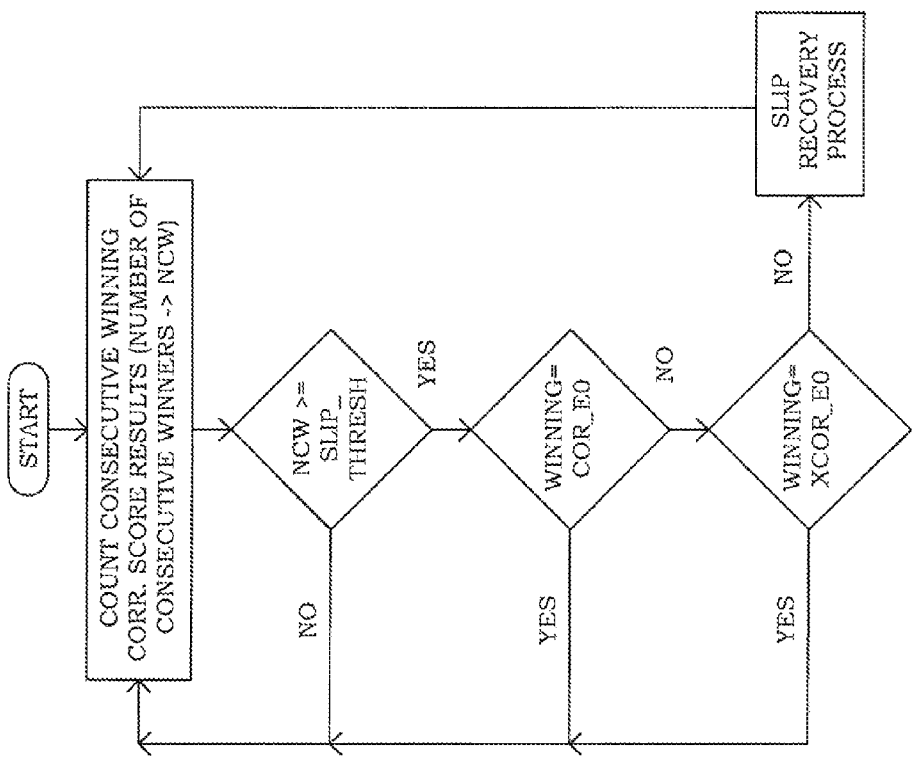
FIG. 10 is a diagram depicting the slip recovery process of the firmware of the soft decision analyzer firmware in accord with one possible embodiment described herein.
Figure 13:
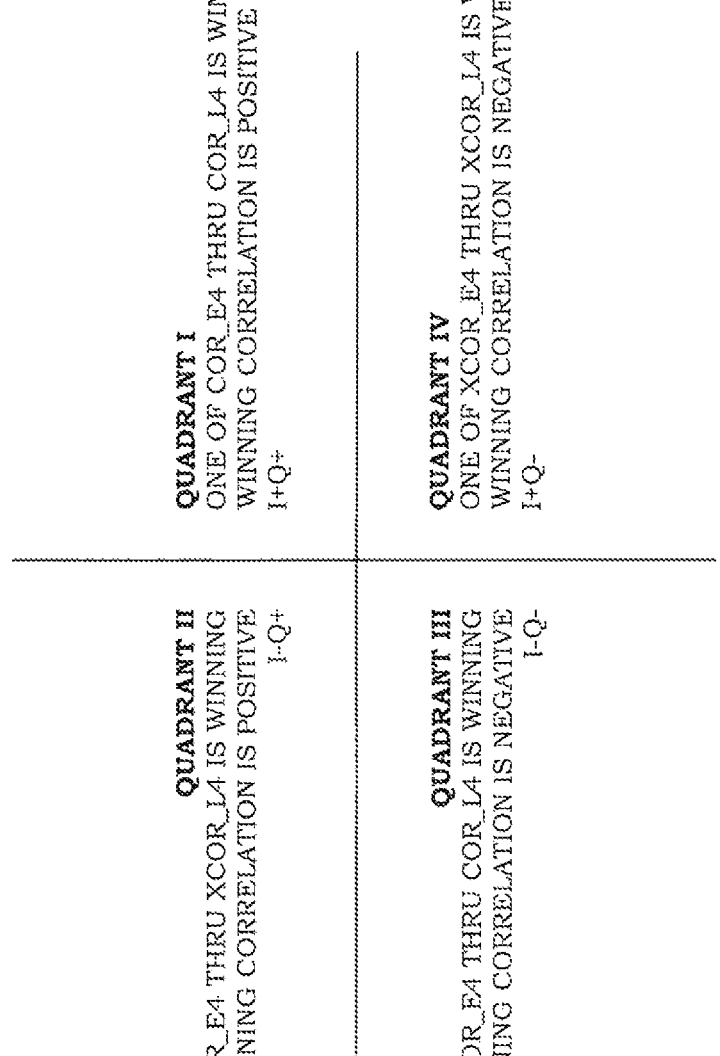
FIG. 13 is a diagram depicting a SQPSK rotational constellation mapped to SDA correlators in accord with one possible embodiment.

Turning to FIG. 13, a diagram shows the possible data polarity operating environment of a receiver. Once the receiver assigns a polarity sense to the soft decision sign bit of TEST stream 112, it becomes possible to describe the receiver as operating in one of four quadrants. As discussed before, SQPSK and QPSK systems have four quadrants of operation that fall into their "constellation". Determination of whether the receiver has altered its assignment of polarity sense of the soft decision sign bit is made by categorizing whether the winning correlation results comes from the COR_E4 through COR_L4 group of correlators or XCOR_E4 through XCOR._L4 group of correlators. Similar to the detection of a slip, changes to the winning group of correlators or changes to the sign of the winning score sign that persist for SLIP_THRESHOLD number of REF clock periods indicate the occurrence of a constellation rotation. Note that rotations due to shifts between the COR_E0 correlator and XCOR_E0 correlator do not initiate the slip recovery process as depicted in FIG. 10, but will register as a constellation rotation. Constellation changes accompanied by slips will induce the slip recovery process resulting in SDA 100 simultaneously correcting for both the rotation and the slip. FIG. 13 depicts the associated winning correlator groups and polarity of the correlation score with the associated constellation quadrant. The interpretation relies on an intended mapping of the receiver's I channel stream data to the physical TDI_A port of SDA 100 and the receiver's Q channel stream data to the physical TDI_B port of SDA 100.

Figure 14:
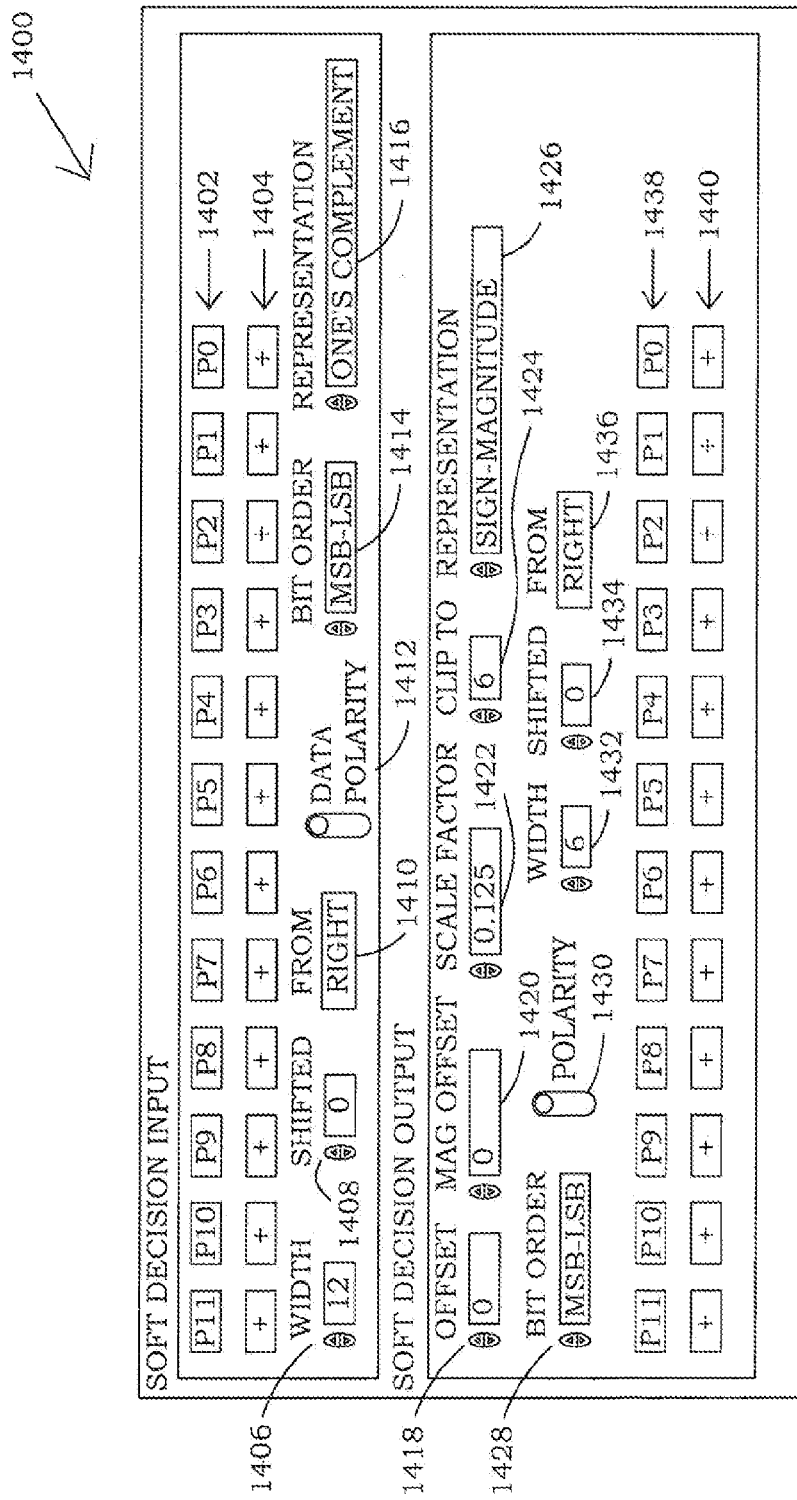
FIG. 14 is a schematic showing an interface utilized to map test data soft decision signals to an internal SDA representation and to map the internal SDA representation to the output representation in accord with an embodiment of the invention.

SDA 100 uses a look-up table technique to map the "test" data soft decision signals to the internal representation and to map the internal representation to the output representation. This process means that an arbitrary relationship between the input format and the output format can be constructed. But complete flexibility is also unmanageable; a user cannot be expected to supply each individual entry in the table. Therefore, a simple interactive control interface is needed that provides the user with flexibility for most situations. Such control interface is shown in FIG. 14.

The scale table generator for SDA 100 is managed by the user from control interface 1400. One significant advantage of interface 1400 is the ability to avoid having to prepare new cables, which can be time consuming. Interface 1400 applies a sequence of transform operations which are calculated as shown-left to right, top to bottom. In practice, the user will find it is more manageable to describe the soft decision input by working through the interface backward: Representation, Bit Order, Data Polarity, Shifting, Width, and then the details of flipping or reordering individual bits when necessary. The soft decision input and the soft decision output sections of interface 1400 can be utilized to connect electrically incompatible RF receivers and baseband signal processors.

The control can be adapted to any bus width, but in one embodiment of implementation, SDA 100 uses a hardware bus width of 12 bits. An external signal can be connected to any of these hardware signal input pins as indicated generally at 1402. The first element of the input control allows any physical signal pin to be selected into any position, or any pin to be overwritten with a constant "1" or constant "0". This control enables pins to be swapped, duplicated, shifted, or overwritten. For example, during setup it is useful to verify wiring by setting all inputs to "0" and checking connections one at a time. Duplicating can be useful to create copies of a signal line to split out to test equipment. Duplicating and overwriting can be used to harden the decisions. Using this control element to change bit order, or shift bits, is unnecessary when other control elements are provided.

The second element allows the signal polarity at any bit position to be inverted as indicated generally at 1404. We have seen for example a receiver that provides a number format expressed as one's complement but with an inverted most significant bit (MSB). Also, with differential signaling, a simple wiring inconsistency that causes a signal inversion is not uncommon.

The third control element as indicated at 1406 selects the width (i.e., how many bit positions are present) of the externally connected signal bus. Widths of 1, 3, 5, 6, 7, 8, and 12 have been seen. This control element is used with the fourth and fifth control elements, as indicated at 1408 and 1410, to select the bits from either end of the bus or out of the middle.

The sixth control element, as indicated at 1412, allows the entire bus signal polarity to be described as true or inverted. Some designers use inverse logic.

The seventh control element, as indicated at 1414, allows the bit order to be selected left-to-right or right-to-left, which means that if the busses are connected in the wrong sequential order, the condition can be corrected with the click of a button.

The eighth control element selects the number representation, as indicated at 1416, either sign-magnitude or one's complement. Two's complement does not sometimes make sense in the context of a communication system because one of the mappings (0) has an ambiguous polarity. However, two's complement can be formed using available control elements.

At this point in the translation, the decisions are represented numerically. Additional control elements are used to describe the translation to make for the output. The first control element (not shown) allows an offset to be applied. This element is simply a floating-point number that is added to the decisions. This compensation can be used, for example, to move the bin centers for Two's complement. It can also be used to compensate a bias in the decision threshold (taken to be zero).

The second element, as indicated at 1418, is also an offset, but is added to the decision magnitudes without shifting the decision threshold. Thus a magnitude offset, as indicated at 1420, of +2 would map a decision of +3 to +5, and −3 to −5, whereas a simple offset of +2 would map a decision of +3 to +5 and −3 to −1. The magnitude offset can be used to adjust the certainty in the decisions.

The third element is a floating point scale factor as indicated at 1422. This element is a simple multiplier that rescales the average amplitude of all the decisions, as processors often assume a particular average amplitude. The third element is also useful when connecting two busses of different widths.

The fourth control element of soft decision output, as indicated at 1424, clips the decisions to a specified number of bits. This clipping could be less than the width of the bus, and can be used to harden the decisions without disturbing any of the physical bus connections.

The fifth control element, as indicated at 1426, selects the output number representation, the sixth, as indicated at 1428, the output bit order. The seventh control element, indicated at 1430, selects the output signal polarity.

The next soft decision output elements select specific physical output pins. The eighth control element, as indicated at 1432, selects the output bus width (which again results in clipping). The outputs can also be collectively selected ("slid") to specific positions at either end of the bus as indicated at control elements 1434 and 1436.

Output signal lines, as indicated at 1438, can be overwritten or re-ordered temporarily or as required. Also, individual output signal lines can be inverted as indicated at 1440.

During an output-stage connectivity check, an example of one useful method comprises the steps of setting the output scale factor to zero (resulting in an all-zeros output) and then toggling each of the individual output signal polarities in turn so as to verify the integrity of connections. Accordingly. SDA 100 is able to calculate and update tables in real-time as the user makes changes.

The foregoing description of the embodiments of the invention has been presented for purposes of illustration and description only. It is not intended to be exhaustive or to limit the invention to the precise form disclosed; and obviously many modifications and variations are possible in light of the above teaching. Such modifications and variations that may be apparent to a person skilled in the art are intended to be included within the scope of this invention as defined by the accompanying claims. In the claims, means-plus-function and step-plus-function clauses are intended to cover the structures or acts described herein as performing the recited function and not only structural equivalents, but also equivalent structures. Thus, while a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. A soft decision analyzer operable for use with at least one of a data source that produces a reference data stream, an RF transmitter that transmits said reference data stream to produce a transmitted data stream, an RF receiver that receives said transmitted data stream and produces a test data stream, and a baseband signal processor operable to detect said test data stream, comprising:

a signal conditioner operable for connection to said RF receiver, said baseband signal processor, and said data source, said signal conditioner being operable to format a plurality of different RF receiver outputs into an internal soft decision analyzer conditioned format, which comprises said test data stream and said reference data stream;

a correlator operable to detect symbol wise alignment of said test data stream and said reference data stream; and a configuration and timing control operable to control operation of said signal conditioner and said correlator.

2. The soft decision analyzer of claim 1, wherein said signal conditioner is operable for bridging between said RF receiver and said baseband signal processor when said RF receiver and said baseband signal processor are incompatible with each other.

3. The soft decision analyzer of claim 1, further comprising a simulator operable to synthetically produce said test data stream and said reference data stream in a plurality of different receiver modulation formats without connection to said data source, said RF transmitter, or said RF receiver.

4. The soft decision analyzer of claim 3, wherein said simulator is operable to slip said test data stream and said reference data stream relative to one another in both forward and reverse directions by a selectable number of symbols.

5. The soft decision analyzer of claim 1, wherein said signal conditioner comprises an input scaler operable to accept soft decision data expressed in a plurality of different mathematical representations for conversion to an internal soft decision analyzer mathematical representation of soft decision data.

6. The soft decision analyzer of claim 5, wherein said signal conditioner further comprises an output scaler operable to convert said internal soft decision analyzer mathematical representation of soft decision data to a selectable mathematical format consistent with that of different types of said baseband signal processor.

7. The soft decision analyzer of claim 6, wherein said signal conditioner under control of said configuration and timing control is operable to remap inputs to account for cables with wiring errors.

8. The soft decision analyzer of claim 1, wherein at least a portion of said signal conditioner and said correlator are implemented in programmable hardware.

9. The soft decision analyzer of claim 1, wherein said soft decision analyzer is operable for use with said reference data stream when said reference data stream is not limited to a particular sequence of data and wherein said test data stream is suitable for detection by said baseband signal processor when said baseband signal processor employs forward error correction techniques.

10. The soft decision analyzer of claim 1, further comprising a simulated data source being operable to produce signals representative of a plurality of different types of RF receivers.

11. The soft decision analyzer of claim 1, wherein said correlator receives the internal soft decision analyzer conditioned format comprising said test data stream and said reference data stream, said correlator being operable for producing an output for adjusting a timing and a sign bit polarity between said test data stream and said reference data stream.

12. The soft decision analyzer of claim 11, wherein said correlator comprises a bank of correlators.

13. The soft decision analyzer of claim 12, wherein said correlator compares respective outputs of said bank of correlators to produce a winning correlation result for detecting said symbol wise alignment.

14. The soft decision analyzer of claim 12, further comprising a slip alignment block that provides feedback for adjusting a symbol wise relative timing between said test data stream and said reference data stream.

15. The soft decision analyzer of claim 12, further comprising a statistical portion operable to collect statistical data of slips and rotations in said test data stream.

16. The soft decision analyzer of claim 15, further comprising a slip alignment block that produces slip statistical data.

17. The soft decision analyzer of claim 16, further comprising a clock phase detector that produces clock edge based slip performance data.

18. The soft decision analyzer of claim 1, further comprising a bit error detection block that receives said correlated reference data and said correlated test data to produce hard decision bit error performance data.

19. The soft decision analyzer of claim 1, wherein said correlator further comprises a test stream buffer and a reference stream buffer operable to provide a first-in, first-out buffering action operable to isolate an output of said test stream buffer and an output of said reference stream buffer from instantaneous data rate discontinuities due to slipping between said test data stream and said reference data stream.

20. The soft decision analyzer of claim 19, wherein at least one of said test stream buffer and said reference stream buffer is operable to bring said test data stream and said reference data stream into symbol wise alignment.

21. A method for a soft decision analysis of communication signals that comprise soft decision data, said method comprising:

providing a signal conditioner operable for connecting to at least one of an RF receiver, a baseband signal processor, and a data source for receiving a reference data stream and a test data stream, said signal conditioner being operable to format a plurality of different RF receiver outputs into an internal soft decision analyzer conditioned format, which comprises said test data stream and said reference data stream; and detecting symbol wise alignment of said reference data stream and said test data stream.

22. The method of claim 21, wherein said signal conditioner is operable fobr bridging between said RF receiver and said baseband signal processor when said RF receiver and said baseband signal processor are incompatible with each other.

23. The method of claim 21, further comprising providing a simulator operable to synthetically produce said test data stream and said reference data stream in a plurality of different receiver modulation formats without connection to said data source and said RF receiver.

24. The method of claim 23, wherein said simulator is operable to slip said test data stream and said reference data stream relative to one another in both forward and reverse directions by a selectable number of symbols.

25. The method of claim 21, wherein said signal conditioner is operable to accept soft decision data expressed in a plurality of different mathematical representations for conversion to an internal soft decision analyzer mathematical representation of soft decision data.

26. The method of claim 25, wherein said signal conditioner is operable to convert said internal soft decision analyzer mathematical representation of soft decision data to a selectable mathematical format consistent with that of different types of said baseband signal processor.

27. The method of claim 26, wherein said signal conditioner is operable to remap inputs to account for cables with wiring errors.

28. The method of claim 21, wherein at least a portion of said signal conditioner is implemented in programmable hardware.

29. The method of claim 21, wherein said soft decision analyzer is operable for use with a reference data stream that is not limited to a canned sequence of data and wherein said test data stream is suitable for detection by said baseband signal processor when said baseband signal processor employs forward error correction techniques.

30. The method of claim 21, wherein said data source is a simulated data source operable to produce signals representative of a plurality of different types of RF receivers.

31. The method of claim 21, further comprising the step of producing an output for adjusting timing between said test data stream and said reference data stream to provide said symbol wise alignment.

32. The method of claim 31, further comprising the step of processing signals from a bank of correlators.

33. The method of claim 32, further comprising the step of comparing respective outputs of said bank of correlators to produce a winning correlation result for detecting said symbol wise alignment.

34. The method of claim 33, further comprising the step of utilizing a most likely condition to produce said winning correlation result in the circumstance of when a tie occurs.

35. The method of claim 32, further comprising the step of providing feedback for adjusting a symbol wise timing between said test data stream and said reference data stream.

36. The method of claim 32, further comprising the step of collecting statistical data of slips and rotations in said test data stream.

37. The method of claim 36, further comprising the step of producing slip statistical data.

38. The method of claim 37, further comprising the step of producing clock edge based slip performance data.

39. The method of claim 21, further comprising the step of utilizing said reference data and said test data when said symbol wise alignment is detected to produce hard decision bit error performance data.

40. The method of claim 21, further comprising buffering at least one of said test data stream and said reference data stream with a first in first out buffering action so as to prevent instantaneous data rate slipping between said test data stream and said reference data stream.

41. The method of claim 40, further comprising the step of utilizing at least one of a test stream buffer and a reference stream buffer to bring said test stream and said reference stream into symbol wise alignment.

* * * * *